United States Patent
Chung

(10) Patent No.: US 10,157,921 B2
(45) Date of Patent: Dec. 18, 2018

(54) INTEGRATED CIRCUIT DEVICES INCLUDING FIN ACTIVE AREAS WITH DIFFERENT SHAPES

(71) Applicant: Samsung Electronics Co., Ltd., Suwon-si, Gyeonggi-do (KR)

(72) Inventor: Jae-yup Chung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/907,344

(22) Filed: Feb. 28, 2018

(65) Prior Publication Data

US 2018/0190655 A1   Jul. 5, 2018

Related U.S. Application Data

(63) Continuation of application No. 15/015,632, filed on Feb. 4, 2016, now Pat. No. 9,947,656.

(30) Foreign Application Priority Data

Mar. 3, 2015   (KR) .......................... 10-2015-029863

(51) Int. Cl.
| | | |
|---|---|---|
| *H01L 29/78* | (2006.01) | |
| *H01L 27/088* | (2006.01) | |
| *H01L 29/10* | (2006.01) | |
| *H01L 21/8234* | (2006.01) | |
| *H01L 29/66* | (2006.01) | |

(52) U.S. Cl.
CPC .. *H01L 27/0886* (2013.01); *H01L 21/823412* (2013.01); *H01L 21/823431* (2013.01); *H01L 21/823481* (2013.01); *H01L 29/1095* (2013.01); *H01L 29/66818* (2013.01); *H01L 29/785* (2013.01); *H01L 29/7854* (2013.01)

(58) Field of Classification Search
CPC ................. H01L 29/045; H01L 29/785; H01L 29/66818
See application file for complete search history.

(56) References Cited

U.S. PATENT DOCUMENTS

| | | |
|---|---|---|
| 7,148,541 B2 | 12/2006 | Park et al. |
| 7,453,124 B2 | 11/2008 | Adan |
| 8,629,512 B2 | 1/2014 | Liaw |
| 8,680,625 B2 | 3/2014 | Fan et al. |
| 8,729,607 B2 | 5/2014 | Itokawa et al. |
| 8,724,508 B2 | 6/2014 | Cheng et al. |
| 8,883,570 B2 | 11/2014 | Lu |

(Continued)

FOREIGN PATENT DOCUMENTS

KR   1020110024480   3/2011

*Primary Examiner* — Thomas L Dickey
(74) *Attorney, Agent, or Firm* — Ward and Smith, P.A.

(57) ABSTRACT

An integrated circuit device can include a substrate having a first area and a second area and a pair of first fin-shaped active areas each having a first shape protruding from the first area in a first direction, adjacent to each other, and extending in a straight line. A fin separation insulating film can be between the pair of first fin-shaped active areas in the first area and a second fin-shaped active area can protrude from the second area in the first direction and have a second shape that is different from the first shape, wherein respective widths of each of the pair of first fin-shaped active areas are less than a corresponding width of the second fin-shaped active area.

13 Claims, 22 Drawing Sheets

(56) References Cited

U.S. PATENT DOCUMENTS

| | | |
|---|---|---|
| 8,896,067 B2 | 11/2014 | Bergendahl et al. |
| 8,896,072 B2 | 11/2014 | Tan et al. |
| 9,947,656 B2 * | 4/2018 | Chung ................ H01L 27/0886 |
| 2008/0277745 A1 | 11/2008 | Hsu et al. |
| 2008/0296667 A1 | 12/2008 | Mikasa |
| 2009/0309162 A1 | 12/2009 | Baumgartner .... H01L 29/66818 |
| | | 257/368 |
| 2012/0199888 A1 | 8/2012 | Dai et al. |
| 2013/0270556 A1 | 10/2013 | Hafez et al. |
| 2014/0008734 A1 | 1/2014 | Lu ...................... H01L 21/2652 |
| | | 257/401 |
| 2014/0117426 A1 | 5/2014 | Cho et al. |
| 2014/0131813 A1 | 5/2014 | Liaw |
| 2014/0151766 A1 | 6/2014 | Eneman et al. |
| 2014/0177331 A1 | 6/2014 | Lee |
| 2014/0252414 A1 | 9/2014 | Merckling et al. |
| 2014/0252489 A1 | 9/2014 | Yu et al. |

* cited by examiner

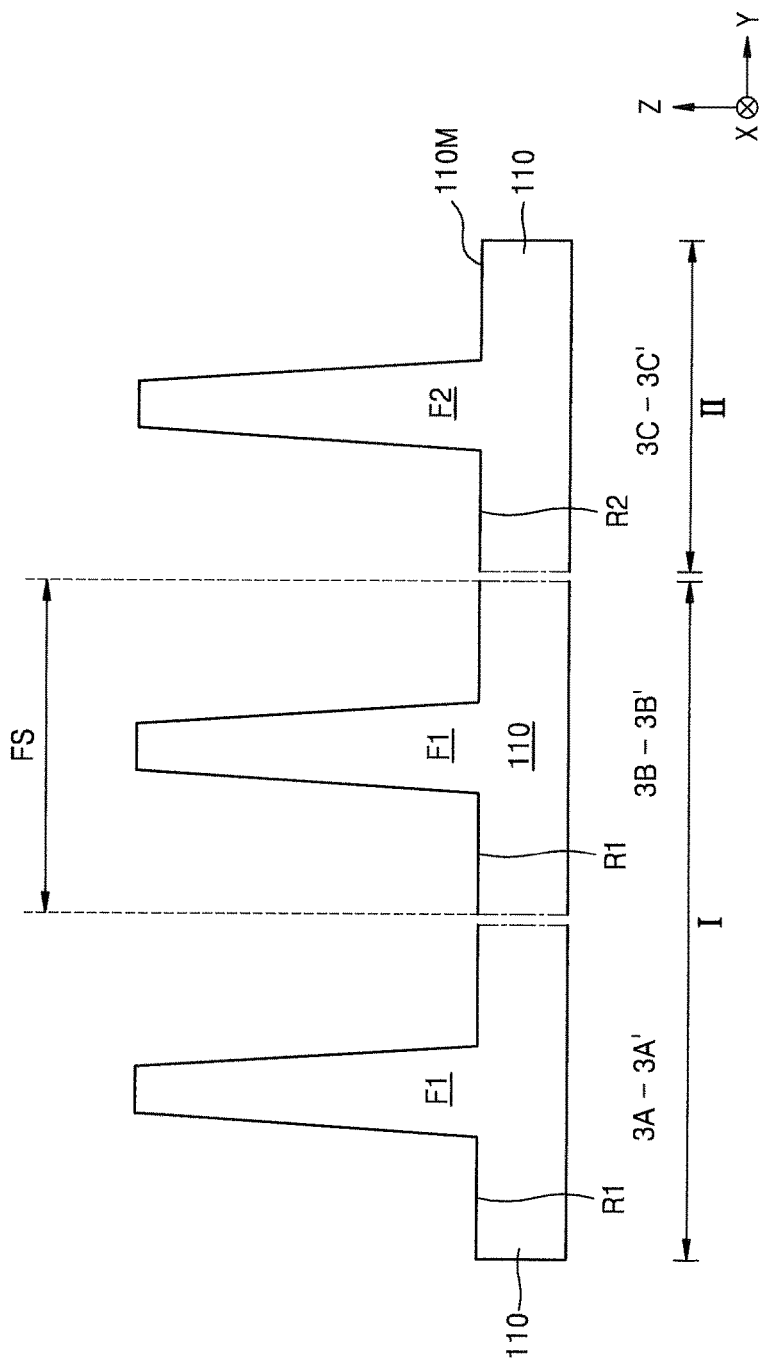

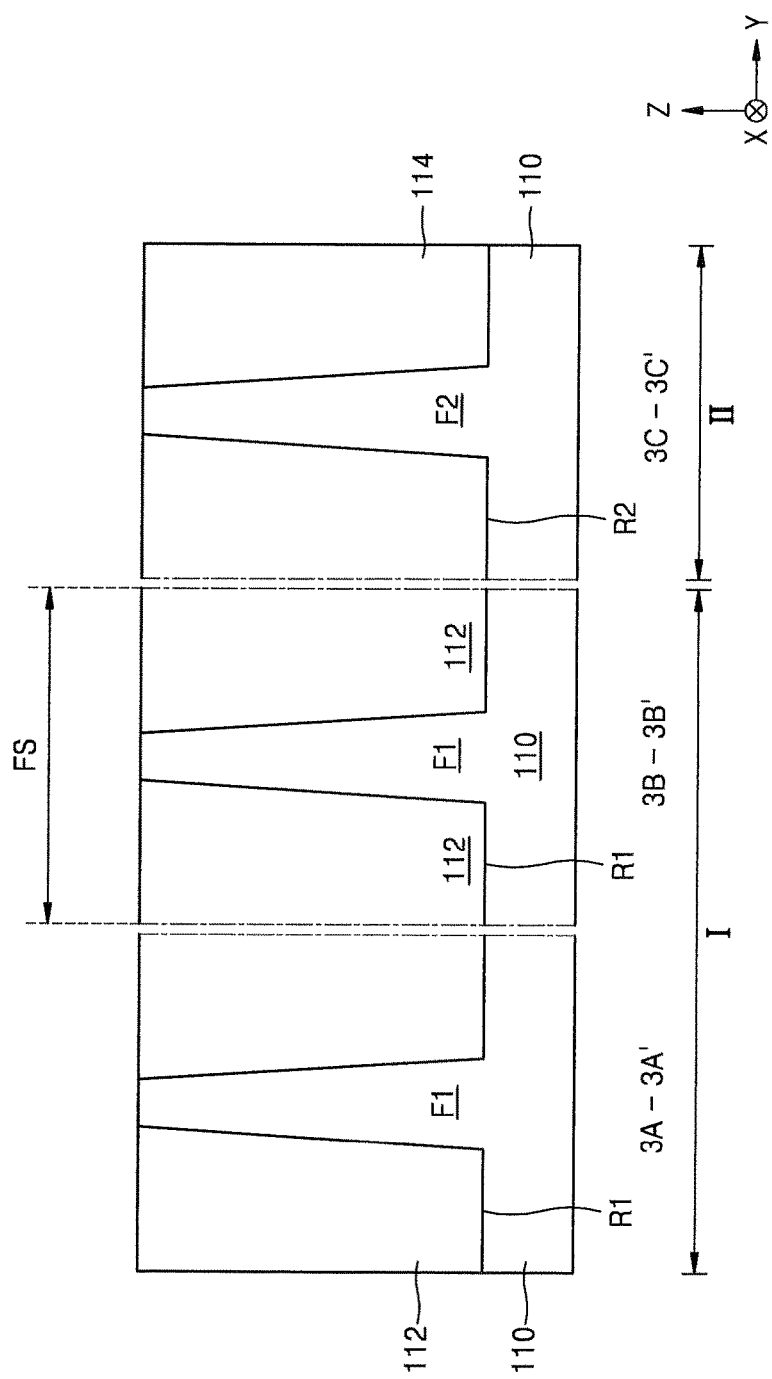

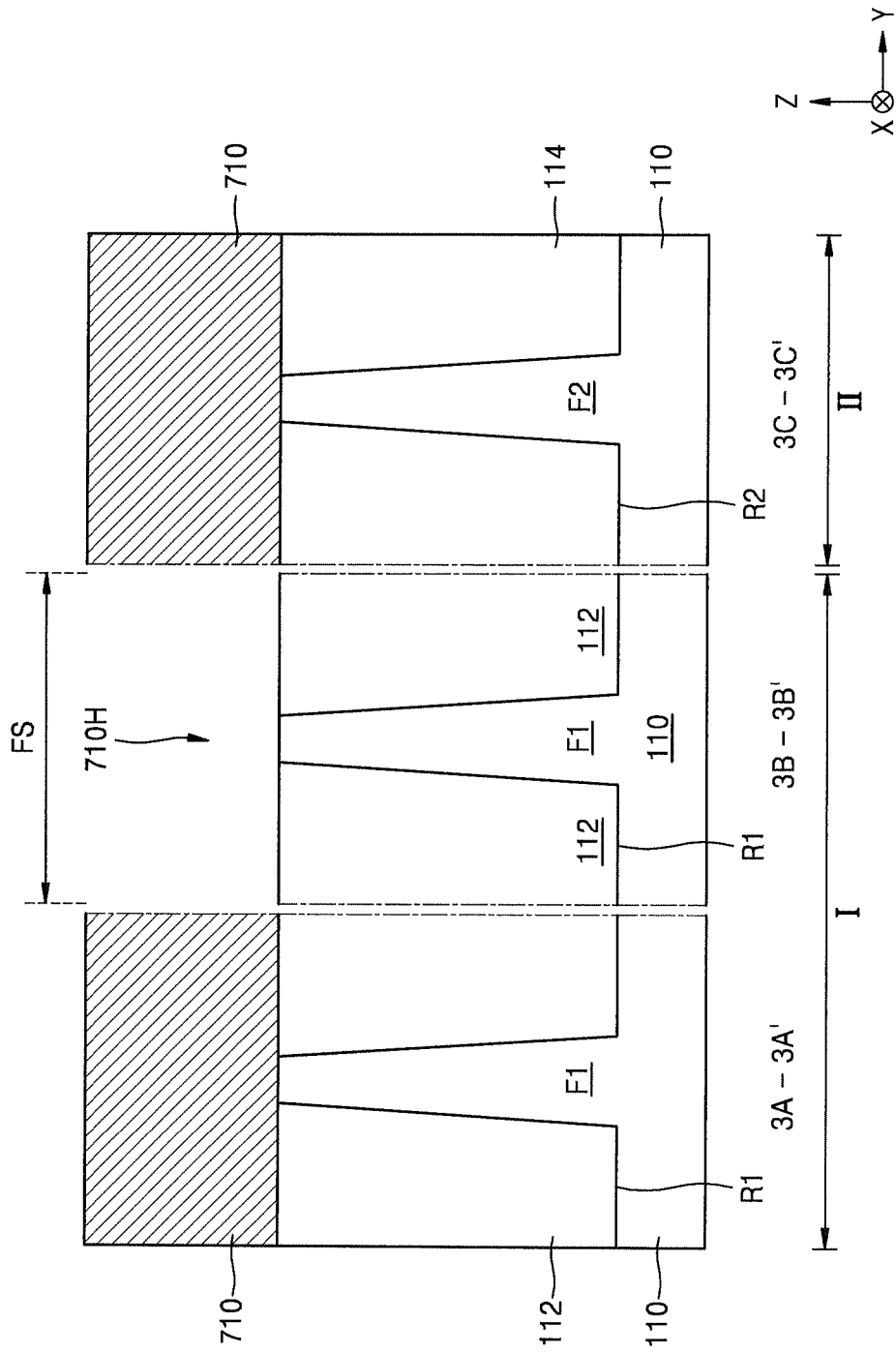

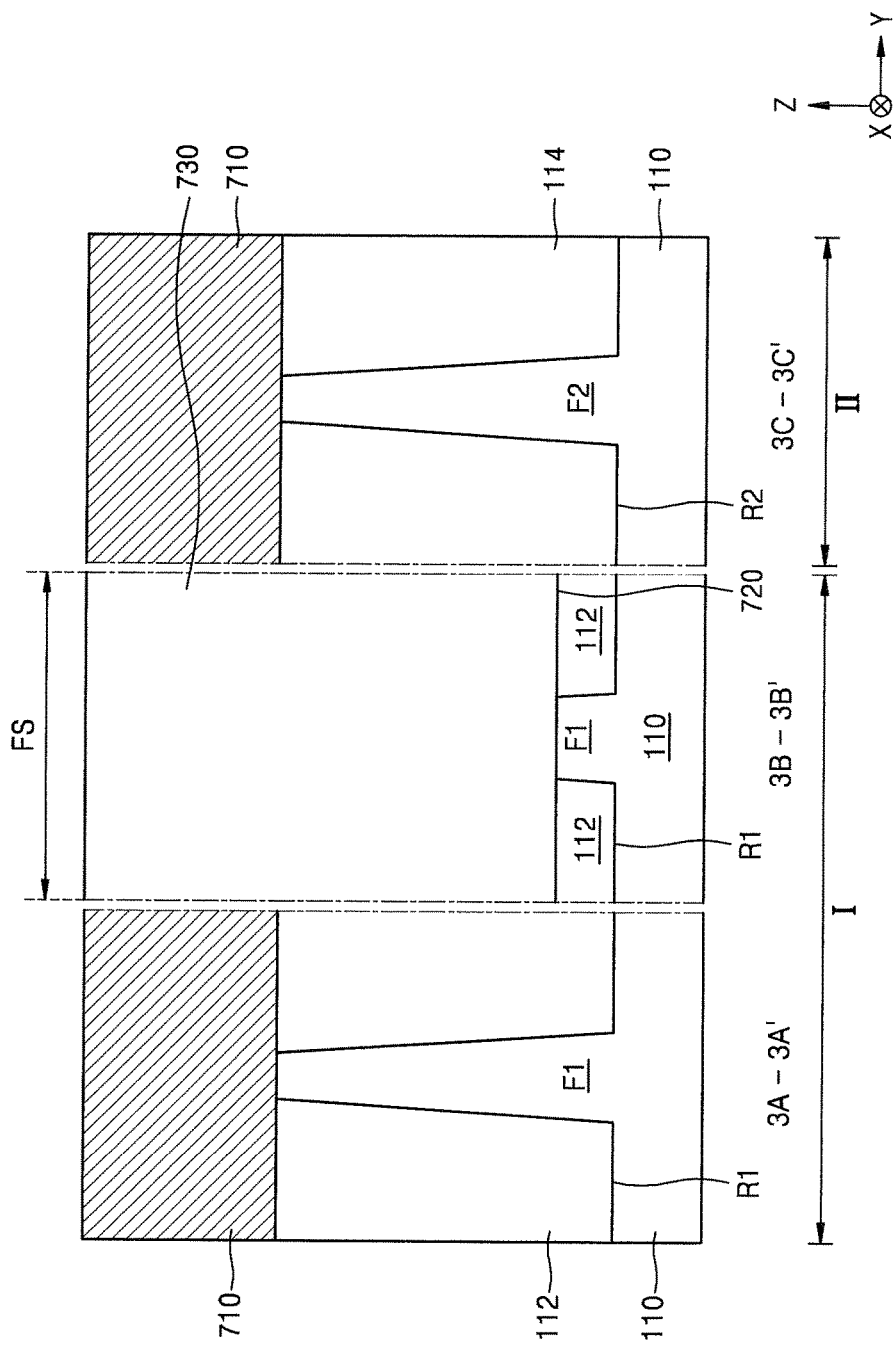

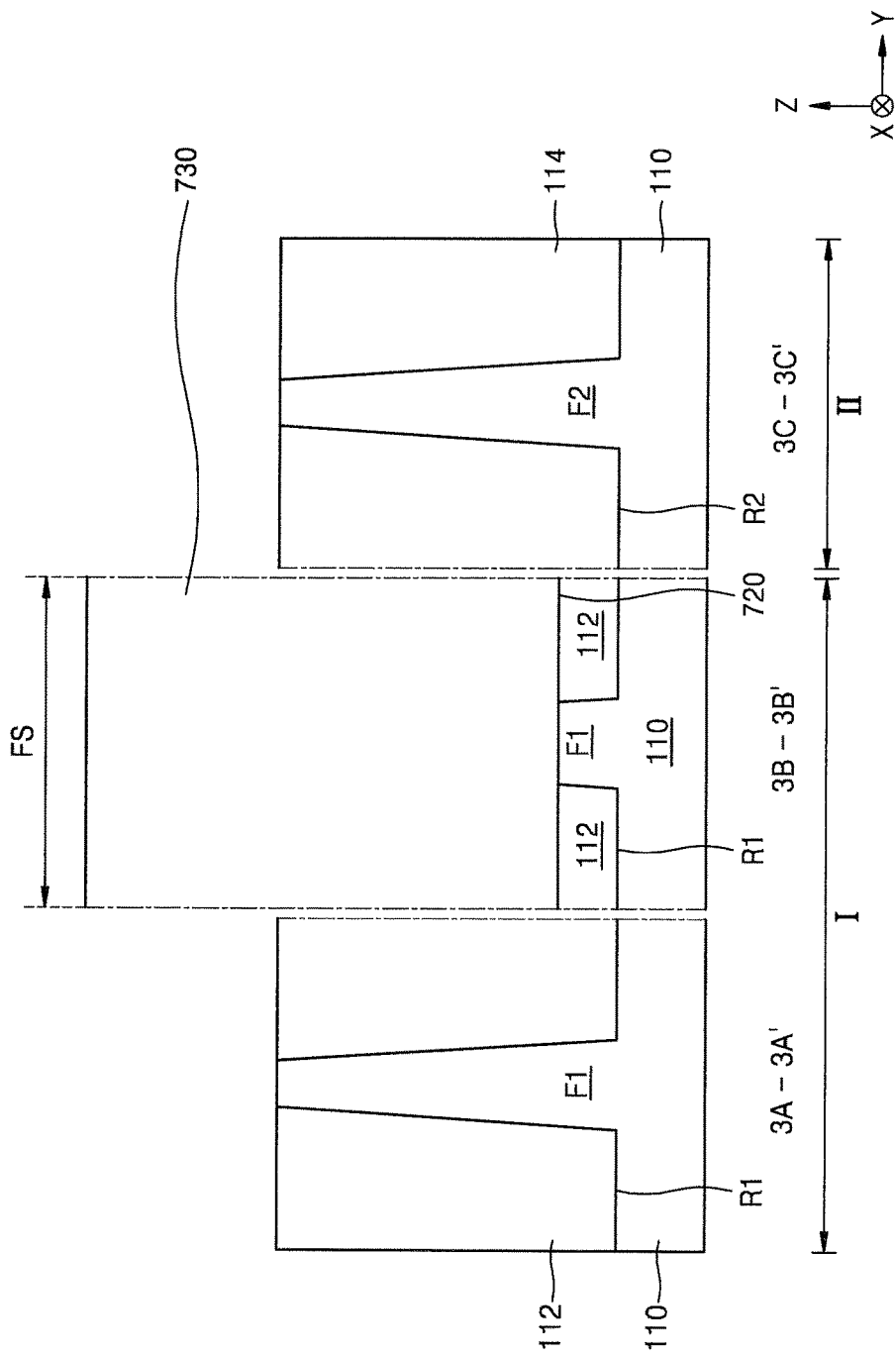

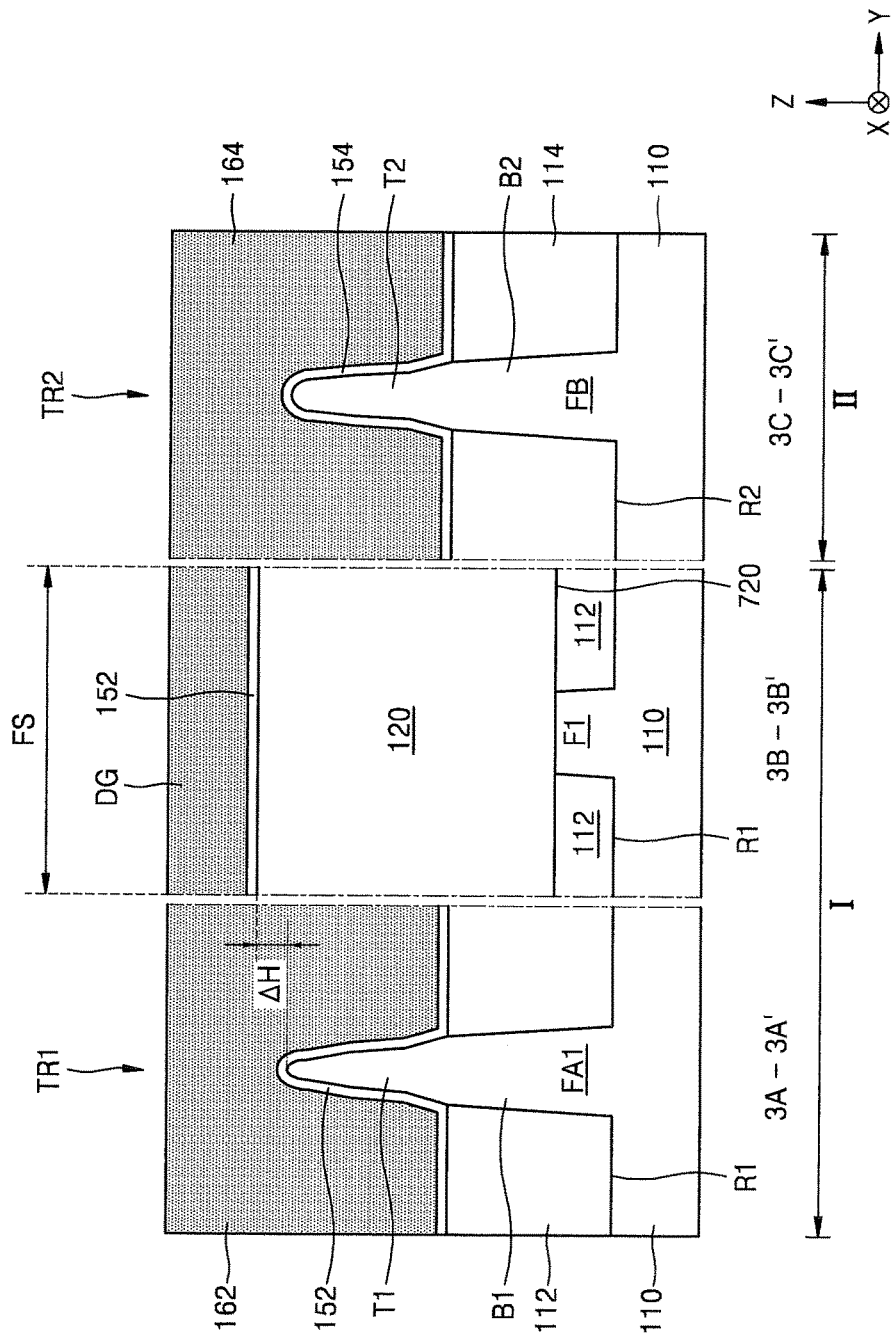

INTEGRATED CIRCUIT DEVICES INCLUDING FIN ACTIVE AREAS WITH DIFFERENT SHAPES

CROSS-REFERENCE TO RELATED APPLICATIONS

This application is a continuation of U.S. patent application Ser. No. 15/015,632, filed Feb. 4, 2016, which claims the benefit of Korean Patent Application No. 10-2015-0029863, filed Mar. 3, 2015, the disclosures of which are hereby incorporated herein by reference in their entireties.

FIELD

The inventive concept provides an integrated circuit device having a structure capable of increasing performance of a multi-gate transistor in a highly scaled integrated circuit device.

BACKGROUND

Multi-gate transistors including a fin-shaped active area on a substrate and a gate on the fin-shaped active area have been implemented as a response to the limitations of power transistor architecture.

SUMMARY

An integrated circuit device according to the inventive concept can include a substrate having a first area and a second area and a pair of first fin-shaped active areas each having a first shape protruding from the first area in a first direction, adjacent to each other, and extending in a straight line. A fin separation insulating film can be between the pair of first fin-shaped active areas in the first area and a second fin-shaped active area can protrude from the second area in the first direction and have a second shape that is different from the first shape, wherein respective widths of each of the pair of first fin-shaped active areas are less than a corresponding width of the second fin-shaped active area.

An integrated circuit device according to the inventive concept can include a substrate comprising a first area and a second area. A first fin-shaped active area can be in the first area and can include a first top portion protruding from the substrate in a first direction; a first width of the first top portion is measured in a second direction across opposing side walls of the first top portion at a first location. A second fin-shaped active area can be in the second area and can include a second top portion protruding from the substrate in the first direction, a second width of the second top portion is measured in the second direction across opposing side walls of the second top portion at a second location that corresponds to the first location, wherein the second width is greater than the first width.

An integrated circuit device according to the inventive concept can include a substrate having a first area and a second area. A pair of first fin-shaped active areas each having a first shape can be protruding from the first area in a first direction, adjacent to each other, and extending in a straight line. A fin separation insulating film can be between the pair of first fin-shaped active areas in the first area and a second fin-shaped active area can be protruding from the second area in the first direction and have a second shape that is different from the first shape, wherein respective widths of each of the pair of first fin-shaped active areas are less than a corresponding width of the second fin-shaped active area.

BRIEF DESCRIPTION OF THE DRAWINGS

FIGS. 7A through 7H are cross-sectional views illustrating a method of manufacturing an integrated circuit device, according to embodiments of the inventive concept;

DETAILED DESCRIPTION

Figure 1:
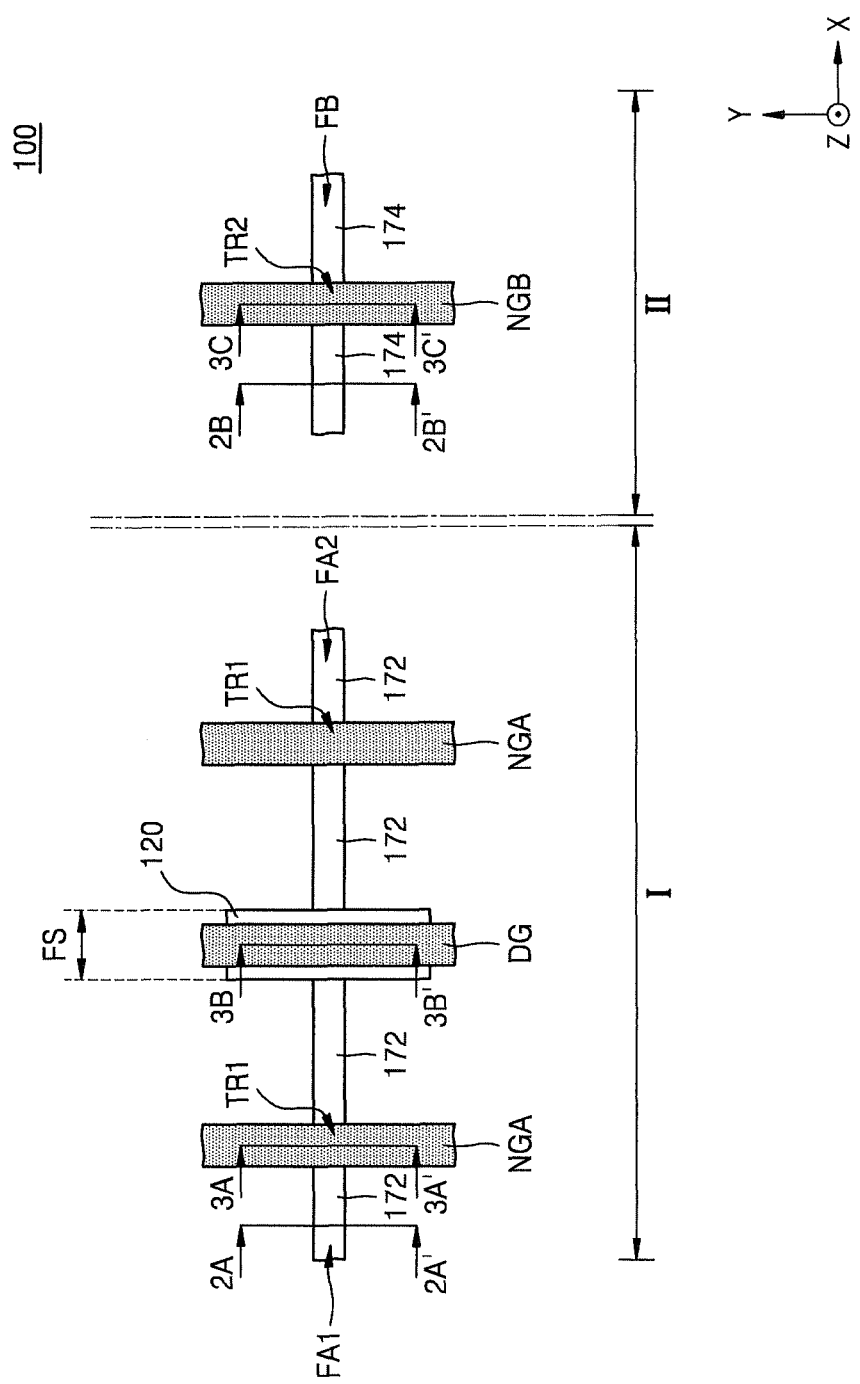
FIG. 1 is a plan layout diagram of an integrated circuit device, according to embodiments of the inventive concept.

Hereinafter, the inventive concept will be described more fully with reference to the accompanying drawings, in which exemplary embodiments of the invention are shown. In the drawings, like elements are labeled like reference numerals and repeated description thereof may be omitted.

This inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art.

In the present description, terms such as 'first', 'second', etc. are used to describe various members, areas, layers, areas, and/or components. However, it is obvious that the members, areas, layers, areas, and/or components should not be defined by these terms. The terms should not be construed as indicating any particular order or whether an element is at the upper or lower side or superior or inferior, and are used only for distinguishing one member, area, layer, area, or component from another member, area, layer, area, or component. Thus, a first member, area, layer, area, or component which will be described may also refer to a second member, area, layer, area, or component, without departing from the teaching of the inventive concept. For example, without departing from the scope of the inventive concept, a first component may be referred to as a second component, and similarly, a second component may be referred to as a first component.

Unless defined differently, all terms used in the description including technical and scientific terms have the same meaning as generally understood by those skilled in the art. Terms that are commonly used and defined in a dictionary should be construed as having the same meaning as in an associated technical context, and unless defined apparently in the description, the terms are not ideally or excessively construed as having formal meaning.

When an embodiment is implementable in another manner, a predetermined process order may be different from a described one. For example, two processes that are consecutively described may be substantially simultaneously performed or may be performed in an opposite order to the described order.

In the drawings, for example, according to the manufacturing techniques and/or tolerances, shapes of the illustrated elements may be modified. Thus, the inventive concept should not be construed as being limited to the embodiments set forth herein, and should include, for example, variations in the shapes caused during manufacture. As used herein, the term "and/or" includes any and all combinations of one or more of the associated listed items.

FIG. 1 is a plan layout diagram of an integrated circuit device 100, according to embodiments of the inventive concept.

Referring to FIG. 1, the integrated circuit device 100 may include a first area I and a second area II.

The first area I and the second area II may be directly adjacent to each other or may be spaced apart from each other. In some embodiments, the first area I and the second area II may perform the same or similar functions. In some other embodiments, the first area I and the second area II may perform different functions. For example, the first area I may be a part of a logic area, and the second area II may be another part of the logic area. In some other embodiments, the first area I may be one area selected from a memory area and a non-memory area, and the second area II may be another area selected from the memory area and the non-memory area.

The logic area may include various types of logic cells including a plurality of circuit elements such as a transistor, a register, etc. as a standard cell performing a desired logic function such as a buffer. The logic cell may include, for example, AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), D flip-flop, reset flip-flop, master-slave flip-flop, latch, and the like. However, the above cells are merely examples and the logic cell according to the inventive concept is not limited thereto.

The memory area may include an SRAM area, a DRAM area, an MRAM area, an RRAM area, or a PRAM area. The non-memory area may include the logic area.

The first area I of the integrated circuit device 100 may include a pair of first fin-shaped active areas FA1 and FA2 adjacent to each other and extending in a straight line and a plurality of first normal gates NGA extending across the pair of first fin-shaped active areas FA1 and FA2. A first fin-shaped transistor TR1 may be formed wherever the pair of first fin-shaped active areas FA1 and FA2 and the plurality of first normal gates NGA cross each other.

The pair of first fin-shaped active areas FA1 and FA2 may be spaced apart from each other and is separated by a fin separation insulating film 120 formed in a fin separation area FS interposed therebetween. The fin separation insulating film 120 may extend in a direction that is parallel to the plurality of first normal gates NGA. A dummy gate DG may be formed on the fin separation insulating film 120 between the pair of normal gates NGA. The dummy gate DG may be formed to perpendicularly overlap the fin separation insulating film 120 and may extend in a direction that is parallel to the plurality of first normal gates NGA.

The second area II of the integrated circuit device 100 may include a second fin-shaped active area FB and the second normal gate NGB extending across the second fin-shaped active area FB. A second fin-shaped transistor TR2 may be formed where the second fin-shaped active area FB crosses the second normal gate NGB.

The pair of first fin-shaped active areas FA1 and FA2 are illustrated in the first area I, and the single second fin-shaped active area FB is illustrated in the second area II in FIG. 1 but the inventive concept is not limited thereto. For example, two or more fin-shaped active areas may be formed in each of the first area I and the second area II, and the number of the two or more fin-shaped active areas is not particularly limited thereto.

Figure 2:
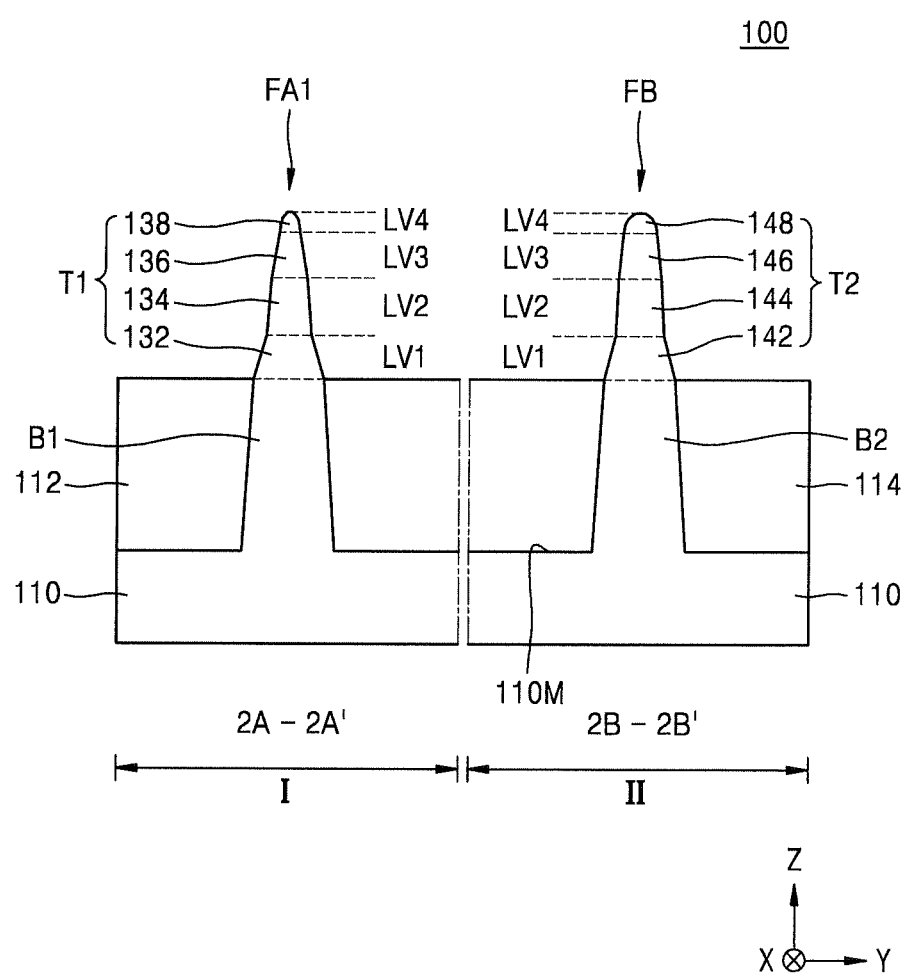
FIG. 2 is a cross-sectional view of an integrated circuit device taken along a line 2A-2A' and a line 2B-2B' of FIG. 1.
Figure 3:
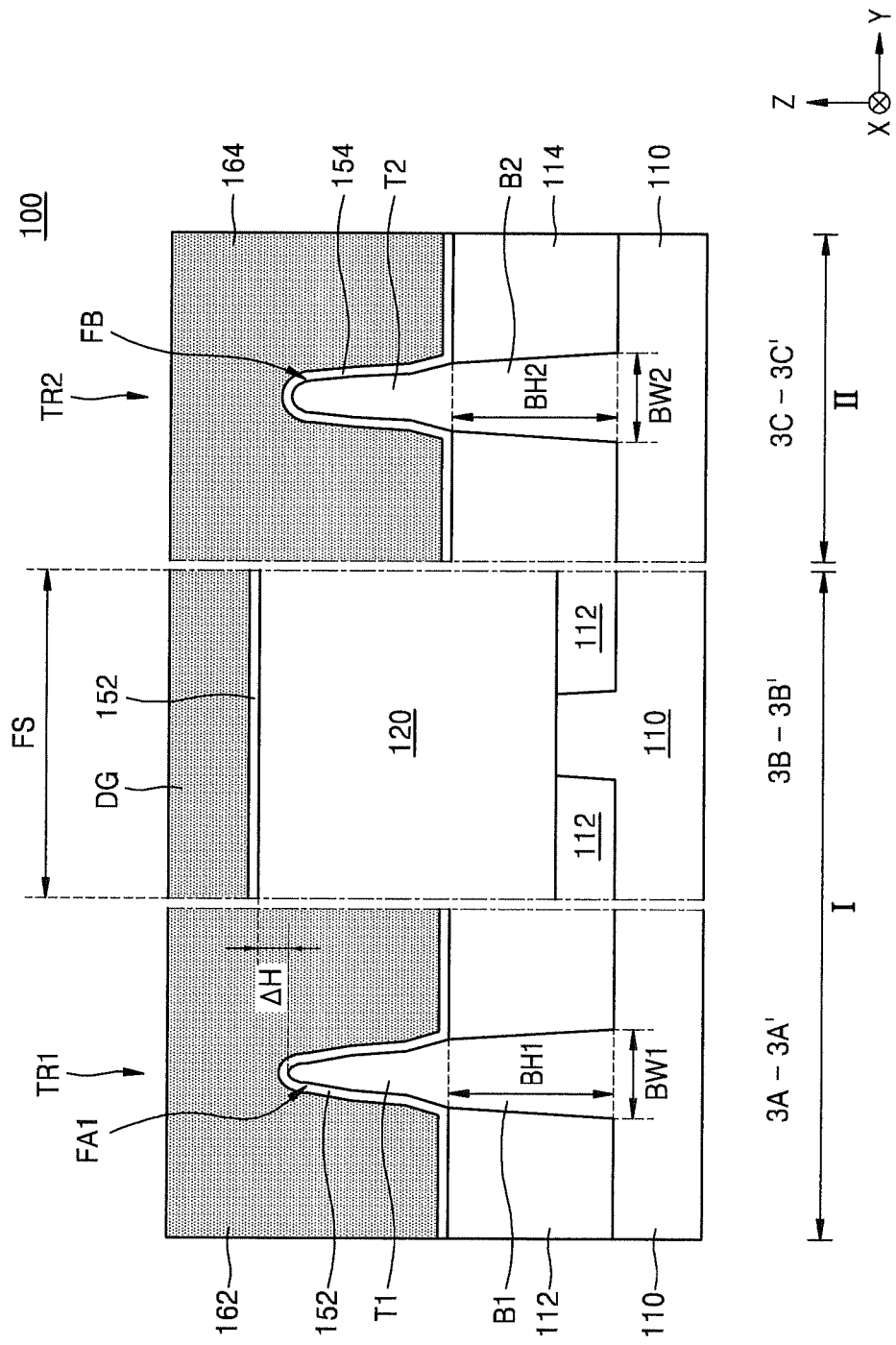
FIG. 3 is a cross-sectional view of an integrated circuit device taken along a line 3A-3A', a line 3B-3B', and a line 3C-3C' of FIG. 1.

FIG. 2 is a cross-sectional view of an integrated circuit device taken along a line 2A-2A' and a line 2B-2B' of FIG. 1. FIG. 3 is a cross-sectional view of an integrated circuit device taken along a line 3A-3A', a line 3B-3B', and a line 3C-3C' of FIG. 1.

A detailed description of the first fin-shaped active area FA1 provided below may apply to the second fin-shaped active area FA2 between the pair of first fin-shaped active areas FA1 and FA2. In some embodiments, the pair of first fin-shaped active areas FA1 and FA2 may have a diagonal shape with respect to the fin separation insulating film 120.

Referring to FIGS. 1 through 3, the first fin-shaped active area FA1 formed in the first area I of the integrated circuit device 100 may protrude from a substrate 110 in a first direction (Z direction) in perpendicular to a main surface 110M of the substrate 110. The first fin-shaped active area FA1 may extend in a second direction (X direction) perpendicular to the first direction (Z direction) on the substrate 110. The first fin-shaped active area FA1 may include a first base portion B1 having side walls covered by a first device isolation film 112 and a first top portion T1 extending from the first base portion B1 in the first direction (Z direction) and protruding from the first device isolation film 112.

As illustrated in FIG. 3, a difference ΔH between a height of an uppermost part of the first top portion T1 of the first fin-shaped active area FA1 and a height of a top surface of the fin separation insulating film 120 in the first area I may be greater than 0. In other words, the height of the top surface of the fin separation insulating film 120 may be greater than the height of the uppermost part of the first fin-shaped active area FA1. However, the inventive concept is not limited as illustrated in FIG. 3. For example, the height of the uppermost part of the first fin-shaped active area FA1 and the height of the top surface of the fin separation insulating film 120 in the first area I may be approximately the same.

The second fin-shaped active area FB formed in the second area II of the integrated circuit device 100 may protrude from the substrate 110 in the first direction (Z direction) perpendicular to the main surface 110M of the substrate 110. The second fin-shaped active area FB may extend in the second direction (X direction) perpendicular to the first direction (Z direction) on the substrate 110. The second fin-shaped active area FB may include a second base portion B2 having side walls covered by a second device isolation film 114 and a second top portion T2 extending in the first direction (Z direction) from the second base portion B2 and protruding from the second device isolation film 114.

The substrate 110 may include a semiconductor such as Si or Ge or a compound semiconductor such as SiGe, SiC, GaAs, InAs, or InP. As another example, the substrate 110 may have a silicon on insulator (SOI) structure. The substrate 110 may include a conductive area, for example, an impurity-doped well or an impurity-doped structure. The pair of first fin-shaped active areas FA1 and FA2 and the second fin-shaped active area FB may be obtained by etching a part of the substrate 110 and may be formed of the same material as that of the substrate 110.

Each of the first and second device isolation films 112 and 114 may include an oxide film, a nitride film, or a combination of these.

The first base portion B1 of the first fin-shaped active area FA1 formed in the first area I and the second base portion B2 of the second fin-shaped active area FB formed in the second area II may have approximately the same shape. For example, a width BW1 of a bottom surface of the first base portion B1 and a width BW2 of a bottom surface of the second base portion B2 may be approximately the same. A height BH1 of the first base portion B1 and a height BH2 may be approximately the same.

As shown in FIG. 2, the first top portion T1 of the first fin-shaped active area FA1 formed in the first area I may include a first lower section active area 132, a first middle section active area 134, a first upper section active area 136, and a first tip active area 138 that are sequentially arranged in the first direction (Z direction) from the first base portion B1 and are a unitary structure. For example, in some embodiments, the first portion T1 can be etched from the material that provides the respective active area.

The first lower section active area 132 may be positioned at a first level LV1 of the first base portion B1 in the first area I. The first middle section active area 134 may be positioned at a second level LV2 higher than the first level LV2 on the first base portion B1. The first upper section active area 136 may be positioned at a third level LV3 higher than the second level LV2 on the first base portion B1. The first tip active area 138 may be positioned at a fourth level LV4 higher than the third level LV3 on the first base portion B1.

Figure 4A:
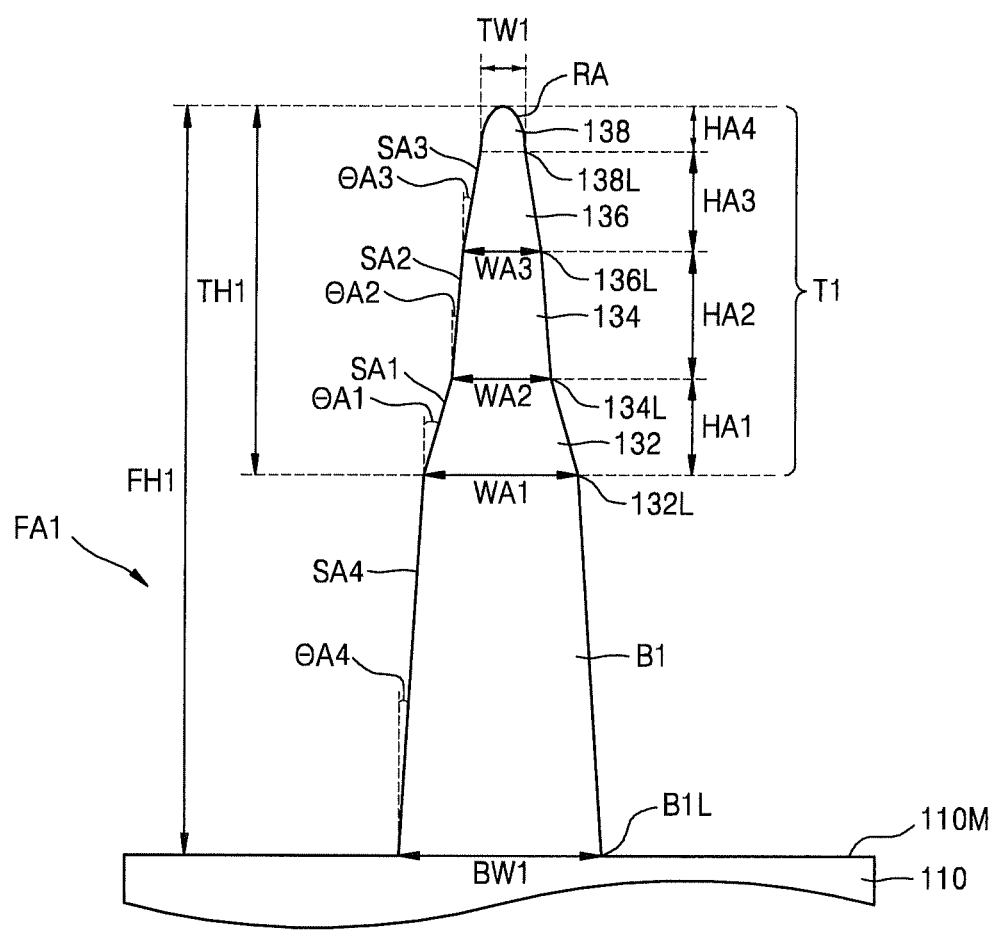
FIG. 4A is an enlarged cross-sectional view of a first fin-shaped active area of an integrated circuit device, according to embodiments of the inventive concept.

FIG. 4A is an enlarged cross-sectional view of the first fin-shaped active area FA1 between the pair of first fin-shaped active areas FA1 and FA2 described with reference to FIGS. 1 through 3, according to embodiments of the inventive concept.

The first fin-shaped active area FA1 between the pair of first fin-shaped active areas FA1 and FA2 is illustrated in FIG. 4A. A description of the first fin-shaped active area FA1 may apply to a description of the other first fin-shaped active area FA2.

Referring to FIG. 4A, the first lower section active area 132 may be on or protrude from the first base portion B1 in the first direction (Z direction) and have a first inclined side wall SA1 extending to have a first inclination angle θA1 in the first fin-shaped active area FA1. In this regard, an "inclination angle" in the first area I means an angle measured relative to a direction perpendicular to the main surface 110M of the substrate 110 and extending in the same direction as a direction in which the first fin-shaped active area FA1 extends, for example, an X-Z plane, and the inclined side wall of the first fin-shaped active area FA1. The first lower section active area 132 may have a first height HA1.

The first middle section active area 134 may be on or protrude from the first lower section active area 132 in the first direction (Z direction) and have a second inclined side wall SA2 extending to have a second inclination angle θA2 less than the first inclination angle θA1. The first middle section active area 134 may have a second height HA2. In some embodiments, the second height HA2 of the first middle section active area 134 may be greater than the first height HA1 of the first lower section active area 132.

The first upper section active area 136 may be on or protrude from the first middle section active area 134 in the first direction (Z direction) and have a third side wall SA3 extending to have a third inclination angle θA3 less than the second inclination angle θA2. The first upper section active area 136 may have a third height HA3. In some embodiments, the third height HA3 of the first upper section active area 136 may be less than the second height HA2 of the first middle section active area 134.

The first tip active area 138 may be on or protrude from the first upper section active area 136 in the first direction (Z direction) and have a rounded upper surface RA or at least some portion (such as the edges) which are rounded. The first tip active area 138 may have a fourth height HA4. The rounded upper surface RA of the first tip active area 138 may have a predetermined curvature radius determined according to a first tip width TW1 and the fourth height HA4 of the first tip active area 138.

In some embodiments, the second inclined side wall SA2 may have the second inclination angle θA2 that is equal to or greater than 0 degree to less than the first inclination angle θA1 in the first middle section active area 134 (0°≤θA2<θA1). In this regard, a case where the second inclination angle θA2 is 0 degree may mean that the second inclined side wall SA2 extends on a plane perpendicular to the main surface 100M of the substrate 110, for example, the X-Z plane.

The first base portion B1 may have a fourth inclined side wall SA4 extending at a fourth inclination angle θA4 with respect to the first direction (Z direction) (θA4<θA1). As illustrated in FIGS. 2 and 3, the fourth inclined side wall SA4 of the first base portion B1 may be covered by the first device isolation film 112. In some embodiments, the fourth inclined side wall SA4 is entirely covered by the first device isolation film 112.

In the first fin-shaped active area FA1 of the first area I, a bottom surface (or portion) 132L of the first lower section active area 132 may have a first width WA1 in a width direction (Y direction) of the first fin-shaped active area FA1. The first width WA1 may be less than the width BW1 of the bottom surface (or portion) B1L of the first base portion B1 (WA1<BW1). A bottom surface (or portion) 134L of the first middle section active area 134 may have a second width WA2 less than the first width WA1 in the width direction (Y direction) of the first fin-shaped active area FA1 (WA2<WA1). A bottom surface (or portion) 136L of the first upper section active area 136 may have a third width WA3 less than the second width WA2 in the width direction (Y direction) of the first fin-shaped active area FA1 (WA3<WA2). A bottom surface (or portion) 138L of the first tip active area 138 may have a first tip width TW1 smaller than the third width WA3 in the width direction (Y direction)

of the first fin-shaped active area FA1 (TW1<WA3). In some embodiments, the portions 132L, 134L, 136L and 138L may correspond to points where the respective angles θA1, θA2, and θA3 are defined.

In some embodiments, the first fin-shaped active area FA1 may have a relatively high aspect ratio and may have a height FH1 that is at least 4 times the width BW1 of the bottom surface B1L of the first base portion B1. In some embodiments, a height TH1 from the bottom surface 132L of the first lower section active area 132 to an apex of the first tip active area 138 may be at least 3 times the first width WA1 of the bottom surface 132L of the first lower section active area 132.

In some embodiments, the fourth height HA4 of the first tip active area 138 may be less than at least one of the height of the first height HA1 of the first lower section active area 132, the second height HA2 of the first middle section active area 134, and the third height HA3 of the first upper section active area 136.

As illustrated in FIG. 3, the first fin-shaped transistor TR1 of the first area I of the integrated circuit device 100 may include a first gate dielectric film 152 covering the first top portion T1 of the first fin-shaped active area FA1 and a first gate line 162 covering the first top portion T1 of the first fin-shaped active area FA1 having the first gate dielectric film 152 interposed therebetween. The first gate line 162 may include the first normal gate NGA illustrated in FIG. 1.

The first gate dielectric film 152 may extend to cover the first inclined side wall SA1 of the first top portion T1, the second inclined side wall SA2, the third inclined side wall SA3, and the rounded outer surface RA. The first gate line 162 may cover the first inclined side wall SA1 of the first top portion T1, the second inclined side wall SA2, the third inclined side wall SA3, and the rounded outer surface RA having the first gate dielectric film 152 interposed therebetween.

Referring to FIGS. 1 through 3, the second top portion T2 of the second fin-shaped active area FB formed in the second area II may include a second lower section active area 142, a second middle section active area 144, a second upper section active area 146, and a second tip active area 148 that are sequentially arranged in the first direction (Z direction) on the second base portion B2 and are integrally connected to each other as a unitary structure. For example, in some embodiments, the second top portion T2 is formed from an active area of the substrate 110 to have the profile shown.

The second lower section active area 142 may be positioned at the first level LV1 that is the same level as that of the first lower section active area 132. The second middle section active area 144 may be positioned at the second level LV2 that is the same level as that of the first middle section active area 134. The second upper section active area 146 may be positioned at the third level LV3 that is the same level as that of the first upper section active area 136. The second tip active area 148 may be positioned at the fourth level LV4 that is the same level as that of the first tip active area 138.

Figure 4B:
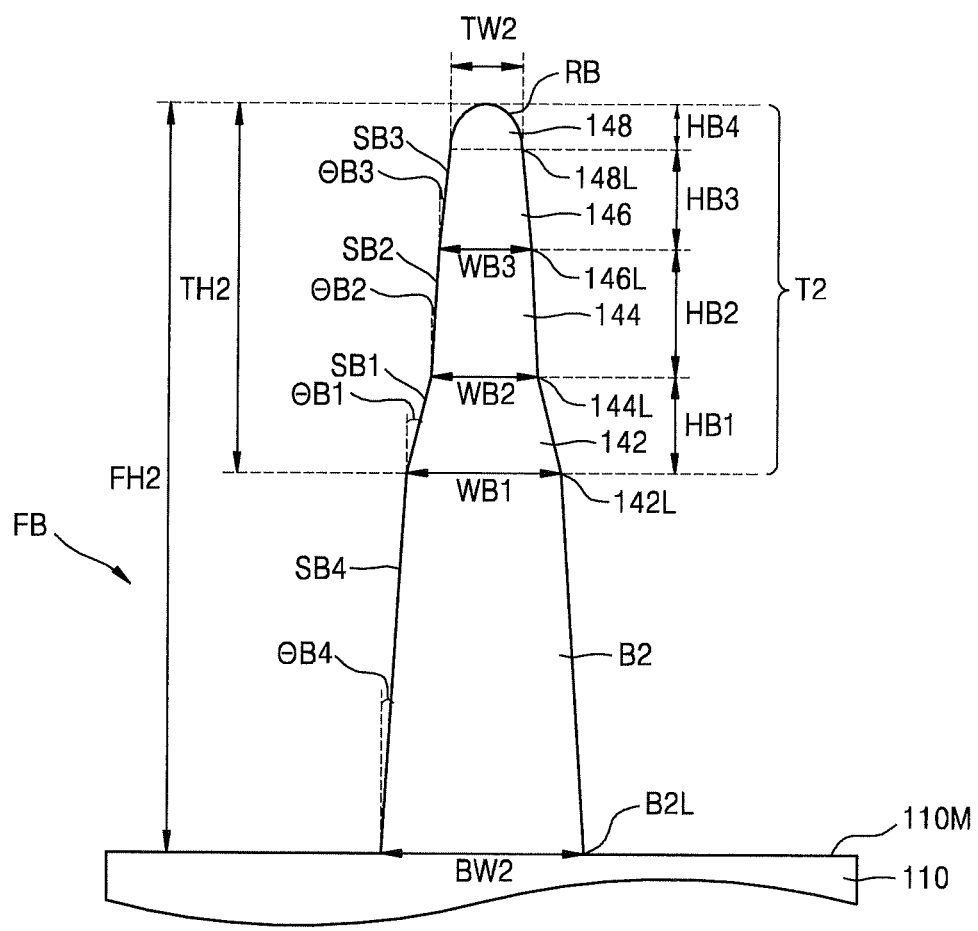
FIG. 4B is an enlarged cross-sectional view of a second fin-shaped active area of an integrated circuit device, according to embodiments of the inventive concept.

FIG. 4B is an enlarged cross-sectional view of the second fin-shaped active area FB described with reference to FIGS. 1 through 3, according to embodiments of the inventive concept.

Referring to FIG. 4B, the second lower section active area 142 may be on or protrude from the second base portion B2 in the first direction (Z direction) and have a first inclined side wall SB1 having a first inclination angle θB1 in the second fin-shaped active area FB. In this regard, an "inclination angle" in the second area II means an angle measured relative to a direction perpendicular to the main surface 110M of the substrate 110 and extending in the same direction as a direction in which the second fin-shaped active area FB extends, for example, the X-Z plane, and the inclined side wall of the second fin-shaped active area FB. The second lower section active area 142 may have a first height HB1.

The first inclination angle θB1 of the first inclined side wall SB1 included in the second lower section active area 142 may be less than the first inclination angle θA1 (see FIG. 4A) of the first inclined side wall SA1 included in the first lower section active area 132 formed in the first area I (θB1<θA1).

The second middle section active area 144 may be on or protrude from the second lower section active area 142 in the first direction (Z direction) and have a second inclined side wall SB2 having a second inclination angle θB2 less than the first inclination angle θB1. The second inclination angle θB2 of the second inclined side wall SB2 included in the second middle section active area 144 may be less than the second inclination angle θA2 (see FIG. 4A) of the second inclined side wall SA2 included in the first middle section active area 134 formed in the first area I (θB2<θA2). In some embodiments, the second inclination angle θB2 of the second inclined side wall SB2 included in the second middle section active area 144 may be 0 degree. The second middle section active area 144 may have a second height HB2. In some embodiments, the second height HB2 of the second middle section active area 144 may be greater than the first height HB1 of the second lower section active area 142 (HB1<HB2).

The second upper section active area 146 may protrude from the second middle section active area 144 in the first direction (Z direction) and have a third inclined side wall SB3 having a third inclination angle θB3 greater than the second inclination angle θB2. In some embodiments, the third inclination angle θB3 of the third inclined side wall SB3 included in the second upper section active area 146 may be less than the third inclination angle θA3 of the third inclined side wall SA3 included in the first upper section active area 136 formed in the first area I. The second upper section active area 146 may have a third height HB3. In some embodiments, the third height HB3 of the second upper section active area 146 may be the same as or greater than the second height HB2 of the second middle section active area 144 (HB3<HB2).

The second tip active area 148 may be on or protrude from the second upper section active area 146 in the first direction (Z direction) and have a rounded upper surface RB or at least some portion (such as the edges) which are rounded. The second tip active area 148 may have a fourth height HB4. The rounded upper surface RB of the second tip active area 148 may have a predetermined curvature radius determined according to a second tip width TW2 and the fourth height HB4 of the second tip active area 148. In some embodiments, the curvature radius of the rounded upper surface RB of the second tip active area 148 may be greater than that of the rounded upper surface RA of the first tip active area 138.

In some embodiments, the second inclined side wall SB2 may have the second inclination angle θB2 that is equal to or greater than 0 degree and is selected within a range less than the first inclination angle θB1 in the second middle section active area 144 (i.e., 0°<θB2<θB1). In this regard, a case where the second inclination angle θB2 is 0 degree may mean that the second inclined side wall SB2 extends on a plane in perpendicular to the main surface 100M of the substrate 110, for example, the X-Z plane, in the first direction (Z direction).

The second base portion B2 may have a fourth inclined side wall SB4 extending at a fourth inclination angle θB4 with respect to the first direction (Z direction) (θB4<θB1). As illustrated in FIGS. 2 and 3, the fourth inclined side wall SB4 of the first base portion B2 may be at least partially covered by the first device isolation film 114. In some embodiments, the fourth inclined side wall SB4 is entirely covered by the first device isolation film 114.

In the second fin-shaped active area FB, a bottom surface (or portion) 142L of the second lower section active area 142 may have a first width WB1 in a width direction (Y direction) of the second fin-shaped active area FB. The first width WB1 may be smaller than the width BW2 of a bottom surface B2L of the first base portion B2 (WB1<BW2).

In the second fin-shaped active area FB, a bottom surface (or portion) 144L of the second middle section active area 144 may have a second width WB2 less than the first width WB1 in the width direction (Y direction) of the second fin-shaped active area FB (WB2<WB1). The second width WB2 of the second middle section active area 144 included in the second fin-shaped active area FB may be greater than the second width WA2 of the first middle section active area 134 of the first fin-shaped active area FA1 (WA2<WB2).

In the second fin-shaped active area FB, a bottom surface (or portion) 146L of the second upper section active area 146 may have a third width WB3 that is the same as or less than the second width WB2 in the width direction (Y direction) of the second fin-shaped active area FB (WB3≤WB2). The third width WB3 of the second upper section active area 144 may be greater than the third width WA3 of the first upper section active area 136 formed in the first area I (WA3<WB3).

In the second fin-shaped active area FB, a bottom surface (or portion) 148L of the second tip active area 148 may have a second tip width TW2 less than the third width WB3 in the width direction (Y direction) of the second fin-shaped active area FB. The second tip width TW2 of the second tip active area 148 may be greater than the first tip width TW1 (see FIG. 4A) of the first tip active area 138 formed in the first area I (TW1<TW2).

In some embodiments, the second fin-shaped active area FB may have a relatively high aspect ratio and may have a height FH2 that is at least 4 times the width BW2 of the bottom surface (or portion) B2L of the second base portion B2. In some embodiments, a height TH2 from the bottom surface (or portion) 142L of the second lower section active area 142 to an apex of the second tip active area 148 may be at least 3 times the first width WB1 of the bottom surface 142L of the second lower section active area 142.

In some embodiments, the fourth height HB4 of the second tip active area 148 in the first direction (Z direction) may be less than at least the first height HB1 of the second lower section active area 142, the second height HB2 of the second middle section active area 144, and the third height HB3 of the second upper section active area 146.

As illustrated in FIG. 3, the second fin-shaped transistor TR2 of the second area II of the integrated circuit device 100 may include a second gate dielectric film 154 covering the second top portion T2 of the second fin-shaped active area FB and a second gate line 164 covering the second top portion T2 of the second fin-shaped active area FB having the second gate dielectric film 154 interposed therebetween. The second gate line 164 may include the second normal gate NGB illustrated in FIG. 1.

The second gate dielectric film 154 may extend to cover the first inclined side wall SB1 of the second top portion T2, the second inclined side wall SB2, the third inclined side wall SB3, and the rounded upper surface RB. The second gate line 164 may cover the first inclined side wall SB1 of the second top portion T2, the second inclined side wall SB2, the third inclined side wall SB3, and the rounded upper surface RB having the second gate dielectric film 154 interposed therebetween.

In some embodiments, each of the first and second gate insulating films 152 and 154 may be formed of a silicon oxide layer, a high-k dielectric layer or a combination thereof. The high-k dielectric layer may be formed of a material having a higher dielectric constant than that of a silicon oxide layer. For example, the first and second gate insulating films 152 and 154 may have a dielectric constant of about 10 to about 25. The high-k dielectric layer may be formed of a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination of thereof, but is not limited thereto. The first and second gate insulating films 152 and 154 may be formed using an atomic layer deposition (ALD) process, a chemical vapor deposition (CVD) process, or a physical vapor deposition (PVD) process. In some embodiments, the first and second gate insulating films 152 and 154 may have the same stack structure. In some embodiments, the first and second gate insulating films 152 and 154 may have different stack structures.

The first and second gate lines 162 and 164 may include a metal containing layer for adjusting a work function and a gap-fill metal containing layer for filling a space formed in an upper portion of the metal containing layer. In some embodiments, the first and second gate lines 162 and 164 may have a structure in which a metal nitride layer, a metal layer, a conductive capping layer, and a gap-fill metal film are sequentially stacked. The metal nitride layer and the metal layer may include at least one selected from the group consisting of Ti, W, Ru, Nb, Mo, Hf, Ni, Co, Pt, Yb, Tb, Dy, Er, and Pd. Each of the metal nitride layer and the metal layer may be formed using the ALD process, a metal organic ALD (MOALD) process, or a metal organic CVD (MOCVD) process. The conductive capping layer may function as a protection layer preventing a surface of the metal layer from being oxidized. The conductive capping layer may function as a wetting layer for facilitating deposition when another conductive layer is deposited on the metal layer. The conductive capping layer may be formed of a metal nitride such as TiN or TaN or a combination thereof, but is not limited thereto. The gap-fill metal film may extend on the conductive capping layer. The gap-fill metal layer may be formed of a W film. The gap-fill metal film may be formed using the ALD process, the CVD process, or the PVD process. The gap-fill metal film may fill a recess space formed by a stepped portion on an upper surface of the conductive capping film, without a void.

As illustrated in FIG. 1, first source/drain areas 172 may be formed on both sides of the first normal gate NGA among the first fin-shaped active areas FA1 and FA2 in the first area I. Second source/drain areas 174 may be formed on both sides of the second normal gate NGB among the second fin-shaped active areas FB in the second area II.

In some embodiments, at least one of the first and second source/drain areas 172 and 174 may include an impurity ion injection area formed in a part of the first and second fin-shaped active areas FA1, FA2, and FB. In some embodiments, at least one of the first and second source/drain areas 172 and 174 may include a semiconductor layer that is epitaxially grown from the first and second fin-shaped active areas FA1, FA2, and FB. At least one of the first and second source/drain areas 172 and 174 may include an embedded SiGe structure including a plurality of epitaxially grown SiGe layers, an epitaxially grown Si layer, or an epitaxially grown SiC layer.

As described with reference to FIGS. 1 through 4B above, the integrated circuit device 100 may include fin-shaped active areas having different shapes selected according to a structure and characteristic of each of devices formed in the first area I and the second area II, thereby easily controlling a leakage current in a highly scaled fin effect transistor (FET), improving performance of the FET, and easily implementing multi-gate transistors performing different functions in the first area I and the second area II.

Figure 5:
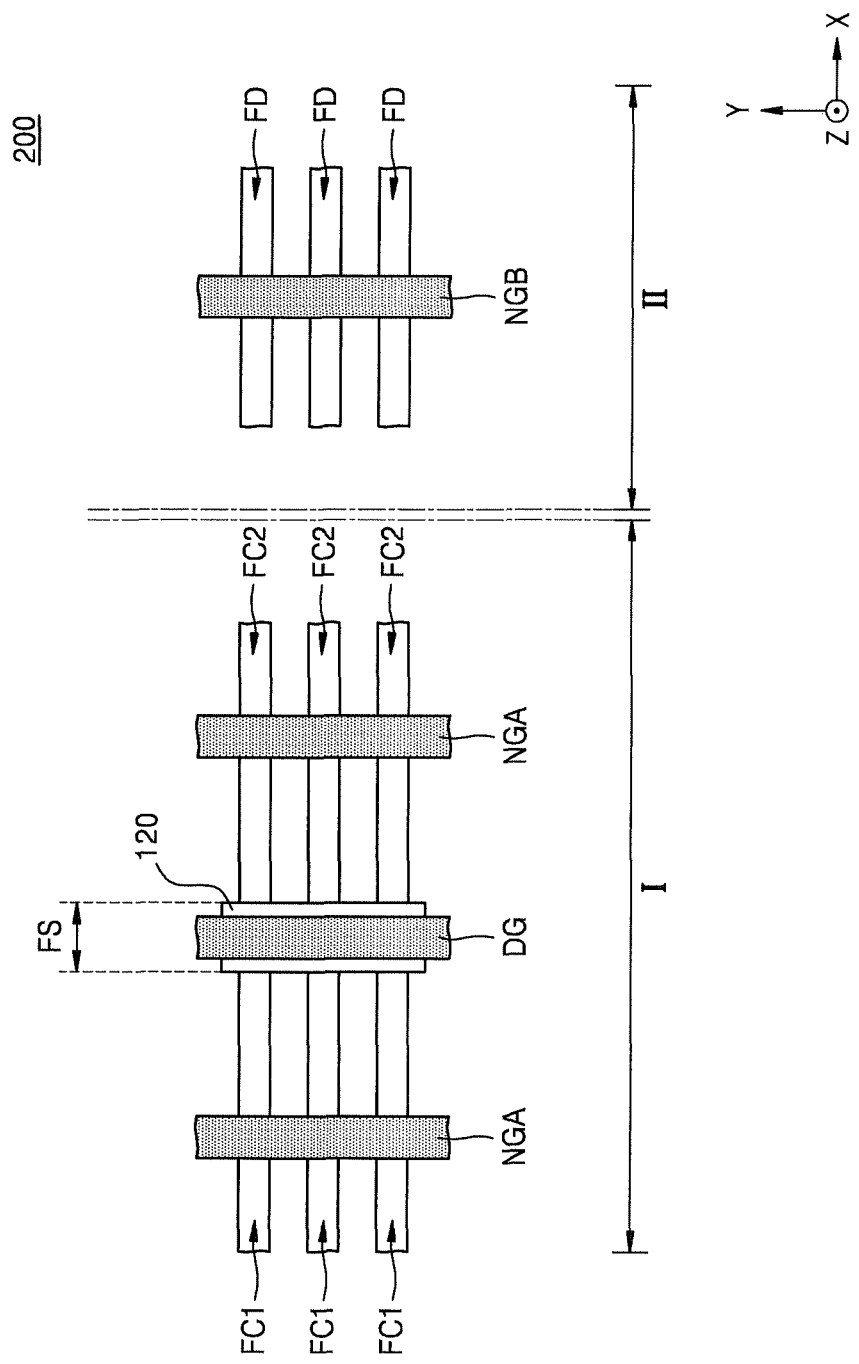
FIG. 5 is a plan layout diagram of an integrated circuit device, according to embodiments of the inventive concept.

FIG. 5 is a plan layout diagram of an integrated circuit device 200, according to embodiments of the inventive concept.

Referring to FIG. 5, the integrated circuit device 200 may include the first area I and the second area II.

A plurality of pairs of first fin-shaped active areas FC1 and FC2 that are adjacent and aligned to each other in a straight line in the first area I of the integrated circuit device 200. The plurality of pairs of first fin-shaped active areas FC1 and FC2 may be disposed to be spaced apart from each other and extend in parallel to each other. One first fin-shaped active area FC1 and one first fin-shaped active area FC2 may be disposed in a straight line having the fin separation insulating film 120 and a dummy gate DG that are formed in the fin separation area FS therebetween.

In the first area I, the plurality of first normal gates NGA may extend in a direction that crosses the plurality of first fin-shaped active areas FC1 or FC2. The plurality of first fin-shaped active areas FC1 and the plurality of first fin-shaped active areas FC2 have the same configurations as described with regard to the first fin-shaped active area FA1 with reference to FIGS. 1 through 3 and 4A.

A plurality of second fin-shaped active areas FD may be formed in the second area II of the integrated circuit device 200. The plurality of second fin-shaped active areas FD may be disposed to be spaced apart from each other and extend in parallel to each other.

In the second area II, the plurality of second normal gates NGB may extend in a direction that crosses the plurality of second fin-shaped active areas FD. The plurality of second fin-shaped active areas FD have the same configurations as described with regard to the second fin-shaped active area FB with reference to FIGS. 1 through 3 and 4B.

In some embodiments, in the first area I and the second area II of the integrated circuit device 200, the amount of current can be adjusted by adjusting the number of each of the plurality of first fin-shaped active areas FC1 and the plurality of first fin-shaped active areas FC2 and the plurality of second fin-shaped active areas FD.

One of the first normal gates NGA may extend across the three first fin-shaped active areas FC1 or FC2 in the first area I, and the second normal gate NGB may extend across the three second fin-shaped active areas FD in the second area II in FIG. 5, but the inventive concept is not limited thereto. For example, one normal gate may extend across two or four more fin-shaped active areas in each of the first area I and the second area II, and the number of fin-shaped active areas in which the one normal gate crosses is not limited.

Figure 6:
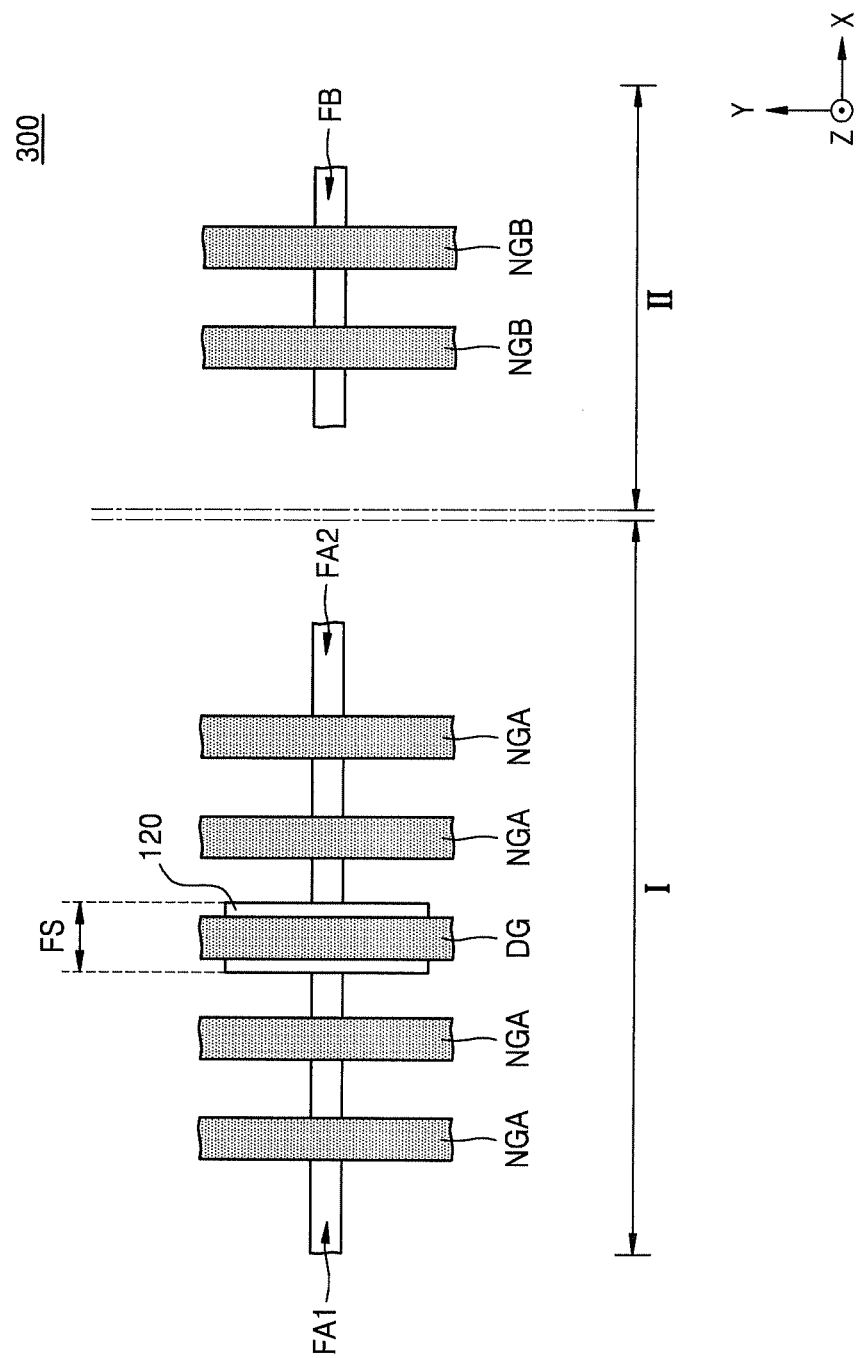
FIG. 6 is a plan layout diagram of an integrated circuit device, according to embodiments of the inventive concept.

FIG. 6 is a plan layout diagram of an integrated circuit device 300, according to embodiments of the inventive concept.

Referring to FIG. 6, the integrated circuit device 300 may include the first area I and the second area II.

The two first normal gates NGA may extend in a direction across the pair of first fin-shaped active areas FA1 and FA2 on the pair of first fin-shaped active areas FA1 and FA2 that are adjacent to each other and extend on a straight line in the first area I of the integrated circuit device 300.

The two second normal gates NGB may extend in a direction across the second fin-shaped active area FB on the second fin-shaped active area FB in the second area II of the integrated circuit device 300.

The two first normal gates NGA may extend on the one first fin-shaped active areas FA1 or FA2 in the first area I, and the two second normal gates NGB may extend on the one second fin-shaped active area FB in the second area II in FIG. 6, but the inventive concept is not limited thereto. For example, the three or more normal gates NGA and NGB may be formed on each of the first fin-shaped active areas FA1 and FA2 and the second fin-shaped active area FB, and the number of the normal gates NGA and NGB is not limited.

FIGS. 7A through 7H are cross-sectional views of a method of manufacturing the integrated circuit device 100, according to embodiments of the inventive concept. FIGS. 7A through 7H are cross-sectional views of the integrated circuit device 100 taken along the line 3A-3A', the line 3B-3B', and the line 3C-3C' of FIG. 1. The exemplary method of manufacturing the integrated circuit device 100 illustrated in FIGS. 1 through 4B will now be described with reference to FIGS. 7A through 7H.

Referring to FIG. 7A, the substrate 110 including the first area I and the second area II may be prepared. Thereafter, a part of the substrate 110 may be removed, a plurality of first trenches R1 may be formed in the first area I of the substrate 110, a plurality of second trenches R2 may be formed in the second area II of the substrate 110, and a plurality of preliminary active areas F1 and F2 defined by the plurality of first and second trenches R1 and R2 may be formed. The plurality of preliminary active areas F1 and F2 may include the first preliminary active area F1 formed in the first area I and the second preliminary active area F2 formed in the second area II.

The first preliminary active area F1 and the second preliminary active area F2 may protrude in a direction (Z direction) perpendicular to the main surface 110M of the substrate 110 and may extend in the X direction, and may be fin-shaped.

In some embodiments, to form the plurality of first and second trenches R1 and R2, a plurality of mask patterns covering a part of an upper surface of the substrate 110 that is to be an active area may be formed, and the substrate 110 may be etched by using the plurality of mask patterns as an etch mask. The plurality of mask patterns may have a structure in which a pad oxide film pattern and a nitride film pattern are sequentially stacked but are not limited thereto.

Referring to FIG. 7B, the first and second device isolation films 112 and 114 respectively filling the plurality of first and second trenches R1 and R2 may be formed in the first area I and the second area II of the substrate 110.

The first device isolation film 112 and the second device isolation film 114 may have planar upper surfaces. An upper surface of the first device isolation film 112 may be positioned at the same level as an upper surface of the first preliminary active area F1 in the first area I. An upper surface of the second device isolation film 114 may be positioned at the same level as an upper surface of the second preliminary active area F2 in the second area II.

In some embodiments, the first device isolation film 112 and the second device isolation film 114 may include an oxide film, a nitride film, or a combination of these but are not limited thereto.

Referring to FIG. 7C, a hard mask pattern 710 may be formed to cover each of exposed upper surfaces of the first preliminary active area F1 and the second preliminary active area F2 and exposed upper surfaces of the first and second device isolation films 112 and 114 in the second area II and the fin separation area FS of the first area I.

An opening 710H exposing the fin separation area FS of the first area I may be formed in the hard mask pattern 710. The hard mask pattern 710 may be formed of a material having an etch selectivity with respect to the first preliminary active area F1 and the second preliminary active area F2 and the first and second device isolation films 112 and 114. For example, the hard mask pattern 710 may include a nitride film, a spin on hard mask (SOH) film, or a combination of theses but is not limited thereto. A photolithography process may be used to form the hard mask pattern 710.

Figure 7D:
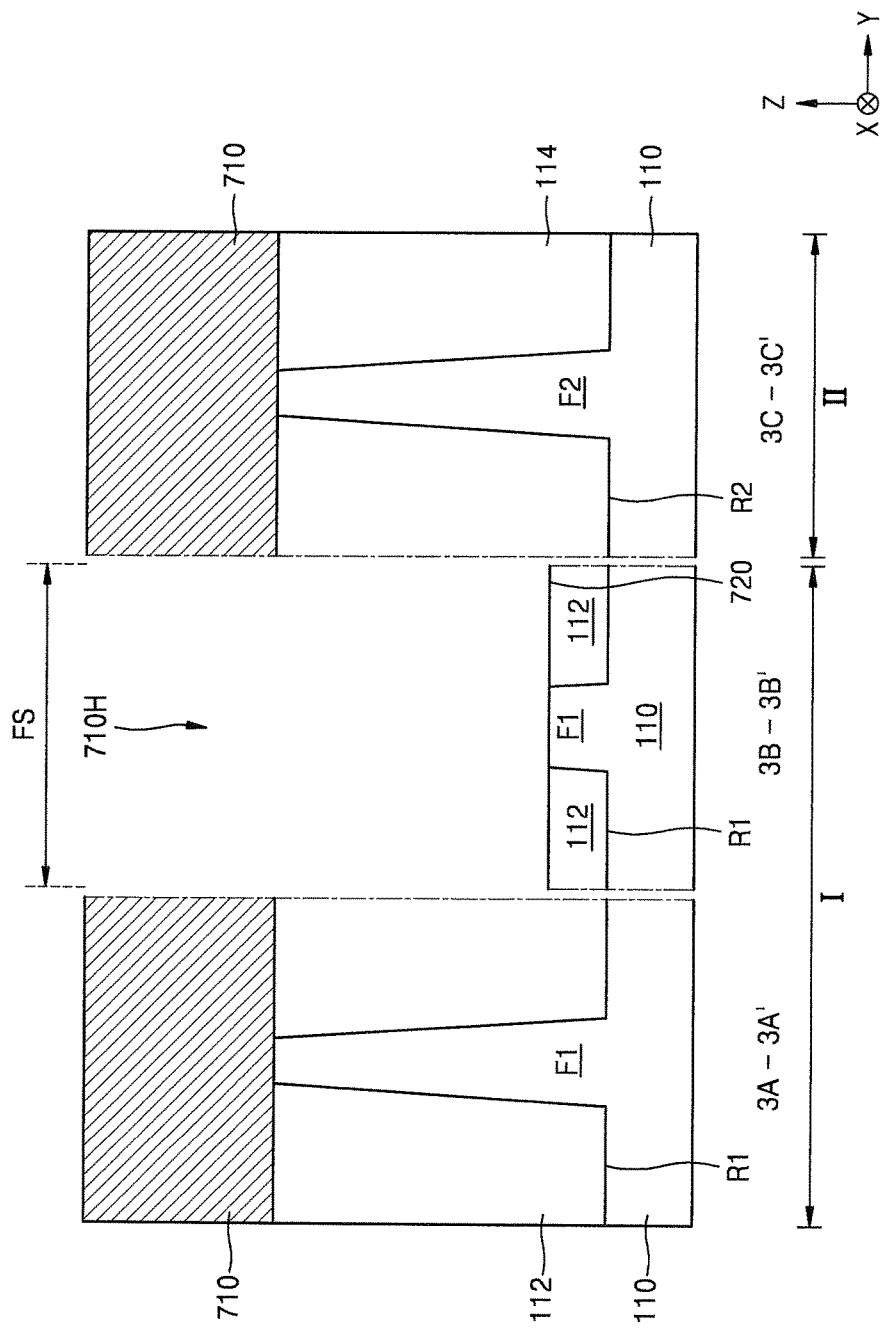

Referring to FIG. 7D, a fin separation trench 720 may be formed in the fin separation area FS by removing, by a predetermined thickness, parts of the first preliminary active area F1 and the first device isolation film 112 that are exposed through the opening 710H of the hard mask pattern 710 by using the hard mask pattern 710 of a resultant of FIG. 7C as an etch mask.

The fin separation trench 720 may be formed such that a level of a bottom surface of the fin separation trench 720 on the substrate 110 is higher than that of a bottom surface of the first trench R1 in FIG. 7D but the inventive concept is not limited thereto. For example, in some embodiments, the level of the bottom surface of the fin separation trench 720 can be lower than or identical to that of the bottom surface of the first trench R1.

Referring to FIG. 7E, an insulating film 730 filling the fin separation trench 720 and the opening 710H of the hard mask pattern 710 may be formed in the first area I.

The insulating film 730 is used to form the fin separation insulating film 120 illustrated in FIGS. 1 through 3 through a subsequent process and may include an oxide film, a nitride film, or a combination of these but a material of the insulating film 730 is not limited thereto.

During an exemplary process of forming the insulating film 730, an insulating material may be deposited to cover an upper surface of the hard mask pattern 710 while filling the fin separation trench 720 and the opening 710H of the hard mask pattern 710. Thereafter, a part of the deposited insulating material may be removed such that the upper surface of the hard mask pattern 710 may be exposed, thereby forming the insulating film 730 having a planar upper surface.

Referring to FIG. 7F, upper surfaces of the first preliminary active area F1 and the second preliminary active area F2 and the first and second device isolation films 112 and 114 may be exposed in the second area II (excluding the fin separation area FS of the first area I) by removing the hard mask pattern 710 from a resultant of FIG. 7E.

Figure 7G:
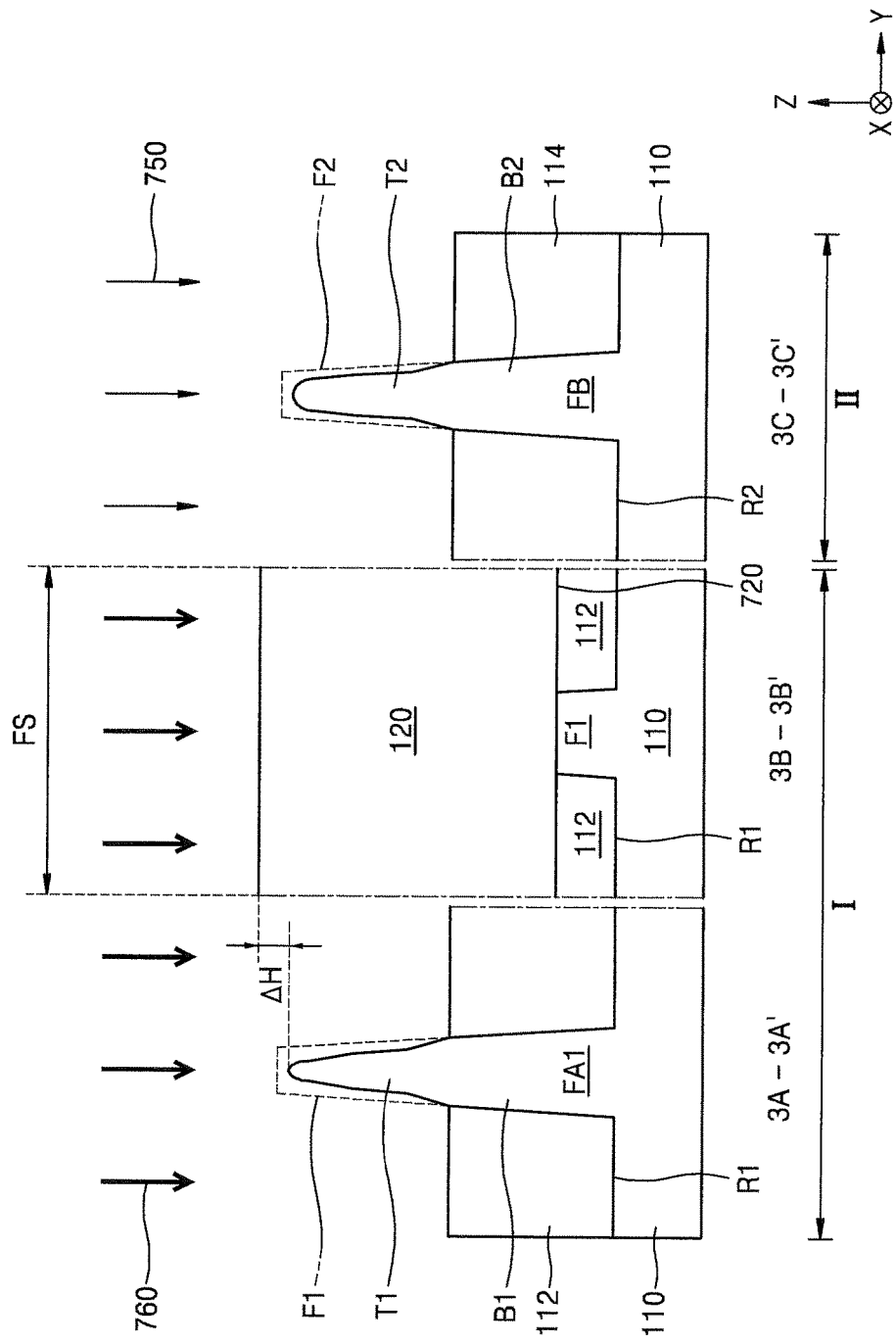

Referring to FIG. 7G, a recess process may be formed on the first and second device isolation films 112 and 114 by removing a part of the first and second device isolation films 112 and 114 from the upper surfaces of the first and second device isolation films 112 and 114 illustrated in FIG. 7F. During the recess process on the first and second device isolation films 112 and 114, an upper part of the insulating film 730 formed in the fin separation area FS of the first area I may be removed.

In some embodiments, a dry etching process, a wet etching process, or an etching process in combination of the dry and wet etch processes may be used to perform the recess process on the first and second device isolation films 112 and 114. The recess process on the first and second device isolation films 112 and 114 and the process of removing the upper part of the insulating film 730 may be simultaneously performed. To this end, the dry etching process, for example, a reactive ion etching (RIE) process may be used.

During the recess process on the first and second device isolation films 112 and 114, a part of the upper surfaces of the first preliminary active area F1 and the second preliminary active area F2 that are exposed in the first area I and the second area II may be consumed since the upper surfaces of the first preliminary active area F1 and the second preliminary active area F2 may be exposed to an etching atmosphere and/or a cleaning atmosphere and accordingly consumed due to oxidation and/or cleaning.

As a result, the fin separation insulating film 120 including a remaining part of the insulating film 730 may be formed in the fin separation area FS of the first area I. A part of a surface of the first preliminary active area F1 as indicated in a broken line may be consumed in the area excluding the fin separation area FS of the first area I, and thus the first fin-shaped active area FA1 may be obtained as described with reference to FIGS. 1 through 3 and 4A, and the first top portion T1 of the first fin-shaped active area FA1 may be exposed. A part of a surface of the second preliminary active area F2 as indicated in a broken line may be consumed in the second area II, and thus the second fin-shaped active area FB may be obtained as described with reference to FIGS. 1 through 3 and 4B, and the second top portion T2 of the second fin-shaped active area FB may be exposed.

In more detail, during the removal of each of the first and second device isolation films 112 and 114 and a part of the insulating film 730 from the resultant of FIG. 7F, since the amount of the second device isolation film 114 removed during the recess process may increase, the size of an exposed area of the second top portion T2 of the second preliminary active area F2 may gradually increase in the second area II, and an upper side of the second top portion T2 may be exposed to an etching atmosphere 750 of the second area II for a longer period of time compared to a lower side thereof. A portion of the second top portion T2 exposed to the etching atmosphere 750 may be consumed up to a predetermined thickness from an outer surface thereof under the etching atmosphere 750 of the second area II. As a result, the second fin-shaped active area FB having a width and shape different from those of the second preliminary active area F2 may be obtained in the second top portion T2. An amount or a thickness of the outer surface of the second top portion T2 that is consumed under the etching atmosphere 750 may be tapered toward the second base portion B2.

Unlike the second area II, the first area I may include the first separation area FS may be included in. Accordingly, similarly as in the second area II, since the amount of the first device isolation film 112 removed during the process of removing the portion of the first device isolation film 112 from the resultant of FIG. 7F may increase, the size of an exposed area of the first top portion T1 of the first preliminary active area F1 may gradually increase in the first area I, and an upper side of the first top portion T1 may be exposed to an etching atmosphere 760 of the first area I for a longer period of time compared to a lower side thereof. A portion of the first top portion T1 exposed to the etching atmosphere 760 of the first area I may be consumed up to a predetermined thickness from an outer surface thereof under the etching atmosphere 760 of the first area I. In addition, the insulating film 730 may be removed from the fin separation area FS, which may influence the etching atmosphere 760 of the first area I. That is, while the insulating film 730 having a greater thickness than that of the first device isolation film 112 is dry etched, reactivity ions associated with etching of the insulating film 730 may be scattered. The scattered reactivity ions may collide with the first top portion T1 protruding from the first device isolation film 112 in the first preliminary active area F1 around the insulating film 730. The etching atmosphere 760 of the first area I may include the reactivity ions influencing a shape of the first top portion T1 by causing an increase in a consumption amount of the first top portion T1, and thus the amount of the outer surface of the first top portion T1 of the first preliminary active area F1 that is consumed under the etching atmosphere 760 of the first area I may be greater than the amount or the thickness of the second top portion T2 consumed in the second area II that does not include the fin separation area FS under the etching atmosphere 750 of the second area II. The amount or the thickness of the outer surface of the first top portion T1 consumed under the etching atmosphere 760 may be tapered toward the first base portion B1.

The first and second fin-shaped active areas FA1 and FB may be formed in the first area I and the second area II, the fin separation insulating film 120 may be formed in the fin separation area FS of the first area I, and then, as illustrated in FIG. 7G, a height of the upper surface of the fin separation insulating film 120 may be greater than that of an uppermost part of the first fin-shaped active area FA1 in the first area I. That is, the difference ΔH between the height of the uppermost part of the first fin-shaped active area FA1 and the height of the upper surface of the fin separation insulating film 120 may be greater than 0. However, the inventive concept is not limited as illustrated in FIG. 7G. For example, the height of the uppermost part of the first fin-shaped active area FA1 and the height of the top surface of the fin separation insulating film 120 in the first area I may be approximately the same.

After the first and second top portions T1 and T2 of the first and second fin-shaped active areas FA1 and FA2 are exposed in the first area I and the second area II, a process of injecting impurity ions for adjusting threshold voltages of the first and second top portions T1 and T2 may be performed. During the process of injecting impurity ions for adjusting threshold voltages, impurity boron (B) ions may be injected in an area in which an NMOS transistor is formed in the first and second top portions T1 and T2, and impurity phosphorus (P) or arsenic (As) may be injected in an area in which a PMOS transistor is formed.

Referring to FIG. 7H, the first gate dielectric film 152 and the first gate line 162 that sequentially cover the first top portion T1 of the first fin-shaped active area FA1 exposed in the first area I, and the second gate dielectric film 154 and the second gate line 164 that sequentially cover the second top portion T2 of the second fin-shaped active area FB exposed in the second area II may be formed.

While the first gate dielectric film 152 and the first gate line 162 are formed in the first area I, the first gate dielectric film 152 and the dummy gate DG may be simultaneously formed on the fin separation insulating film 120 in the fin separation area FS.

The first gate line 162 and the second gate line 164 may respectively constitute the first normal gate NGA and the second normal gate NGB illustrated in FIG. 1.

The first source/drain areas 172 (see FIG. 1) may be formed on both sides of the first gate line 162 in the first fin-shaped active area FA1 in the first area I, and the second source/drain areas 174 (see FIG. 1) may be formed on both sides of the second gate line 164 in the second fin-shaped active area FB in the second area II, thereby manufacturing the integrated circuit device 100 illustrated in FIGS. 1 through 4B.

In some embodiments, the first gate line 162 and the second gate line 164 and the dummy gate DG may be formed using a gate-last process (that may be referred to as a replacement poly-gate (RPG) process) but the inventive concept is not limited thereto. The first and second top portions T1 and T2 of the first and second fin-shaped active areas FA1 and FB may be respectively provided as channel areas of the first and second fin-shaped transistors TR1 and TR2.

In some embodiments, to form the first gate line 162 and the second gate line 164 and the dummy gate DG using the RPG process, a plurality of insulating spacers providing a plurality of gate spaces and an inter-gate insulating film may be formed on the first and second top portions T1 and T2 and the first and second device isolation films 112 and 114. Thereafter, the first and second gate dielectric films 152 and 154 and the first and second gate lines 162 and 164 may be sequentially formed in the plurality of gate spaces defined by the plurality of insulating spacers.

According to the method of manufacturing the integrated circuit device 100 described with reference to FIGS. 7A through 7H above, fin-shaped active areas having different shapes may be formed in the first area I and the second area II, thereby more readily controlling a leakage current in highly scaled FETs, improving performance of the FETs, and easily implementing multi-gate transistors performing different functions in the first area I and the second area II.

Although the method of manufacturing the integrated circuit device 100 is described with reference to FIGS. 7A through 7H above, it will be obvious to one of ordinary skill in the art that the integrated circuit device 200 illustrated in FIG. 5 and the integrated circuit device 300 illustrated in FIG. 6 may be easily manufactured through various modifications and changes within the scope of the inventive concept.

Figure 8:
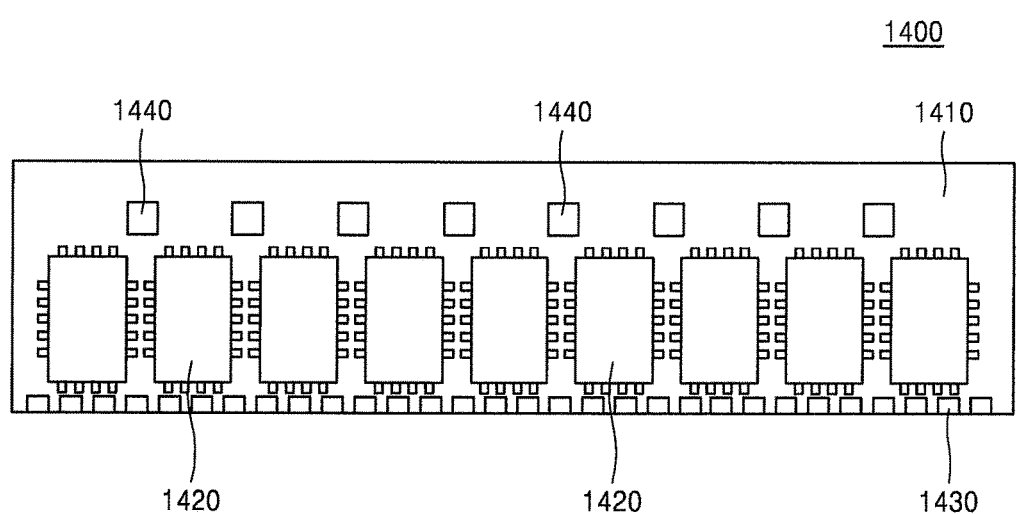
FIG. 8 is a plan view of a memory module according to embodiments of the inventive concept.

FIG. 8 is a plan view of a memory module 1400 according to embodiments of the inventive concept.

The memory module 1400 may include a module substrate 1410 and a plurality of semiconductor chips 1420 attached to the module substrate 1410.

The semiconductor chips 1420 may include an integrated circuit device according to the inventive concept. The semiconductor chips 1420 may include at least one of the integrated circuit devices 100, 200, and 300 according to the embodiments of the inventive concept described with reference to FIGS. 1 through 6 or integrated circuit devices modified or changed from the integrated circuit devices 100, 200, and 300.

A connection unit 1430 that may be inserted into a socket of a mother board may be disposed at one side of the module substrate 1410. A decoupling capacitor 1440 may be disposed on the module substrate 1410. The memory module 1400 according to the inventive concept is not limited to the embodiment illustrated in FIG. 8 but may be manufactured in various forms.

Figure 9:
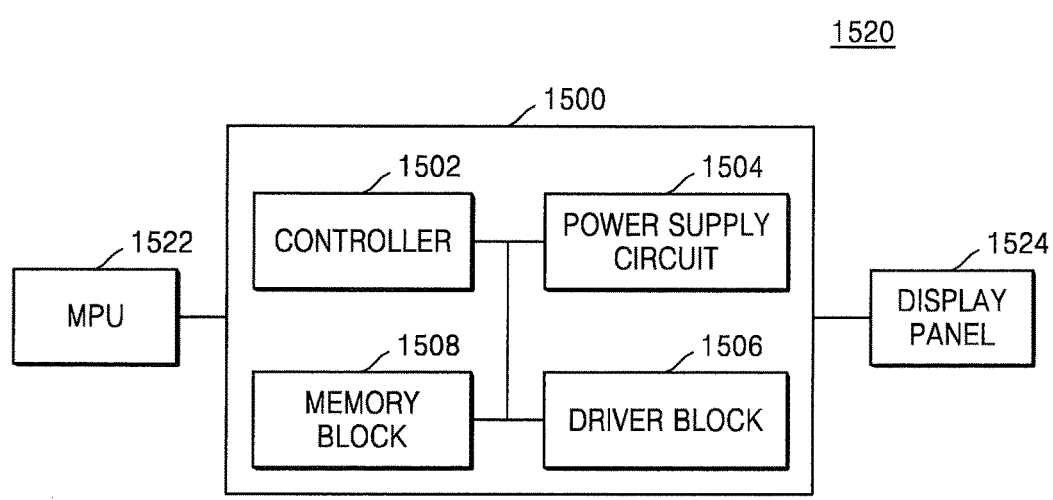
FIG. 9 is a schematic block diagram illustrating a display apparatus including a displayer driver IC (DDI) according to embodiments of the inventive concept.

FIG. 9 is a block diagram illustrating a display apparatus 1520 including a displayer driver IC (DDI) 1500 according to embodiments of the inventive concept.

Referring to FIG. 9, the DDI 1500 may include a controller 1502, a power supply circuit 1504, a driver block 1506, and a memory block 1508. The controller 1502 may receive and decode a command applied from a main processing unit (MPU) 1522, and control each block of the DDI 1500 to perform an operation according to the command. The power supply circuit unit 1504 may generate a driving voltage in response to the control of the controller 1502. The driver block 1506 may drive a display panel 1524 by using the driving voltage generated by the power supply circuit unit 1504 in response to the control of the controller 1502. The display panel 1524 may be a liquid crystal display panel, a plasma display panel, or an organic light emitting diode (OLED) panel. The memory block 1508 may be a block that temporarily stores the command input to the controller 1502 or control signals output from the controller 1502 or stores data, and may include a memory such as RAM or ROM. At least one of the power supply circuit unit 1504 and the driver block 1506 may include at least one of the integrated circuit devices 100, 200, and 300 according to the embodiments of the inventive concept described with reference to FIGS. 1 through 6 or integrated circuit devices modified or changed from the integrated circuit devices 100, 200, and 300.

Figure 10:
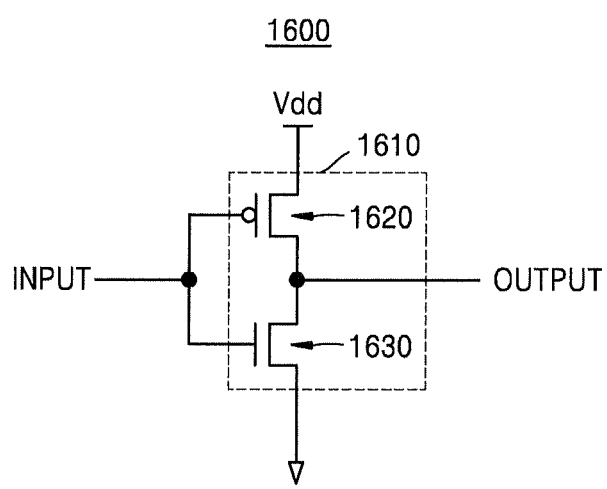
FIG. 10 is a circuit diagram illustrating a complementary metal oxide semiconductor (CMOS) inverter according to embodiments of the inventive concept.

FIG. 10 is a circuit diagram illustrating a CMOS inverter 1600 according to embodiments of the inventive concept.

The CMOS inverter 1600 may include a CMOS transistor 1610. The CMOS transistor 1610 may include a PMOS transistor 1620 and an NMOS transistor 1630 that are connected between a power terminal Vdd and a ground or reference terminal. The CMOS transistor 1610 may include at least one of the integrated circuit devices 100, 200, and 300 according to the embodiments of the inventive concept described with reference to FIGS. 1 through 6 or integrated circuit devices modified or changed from the integrated circuit devices 100, 200, and 300.

Figure 11:
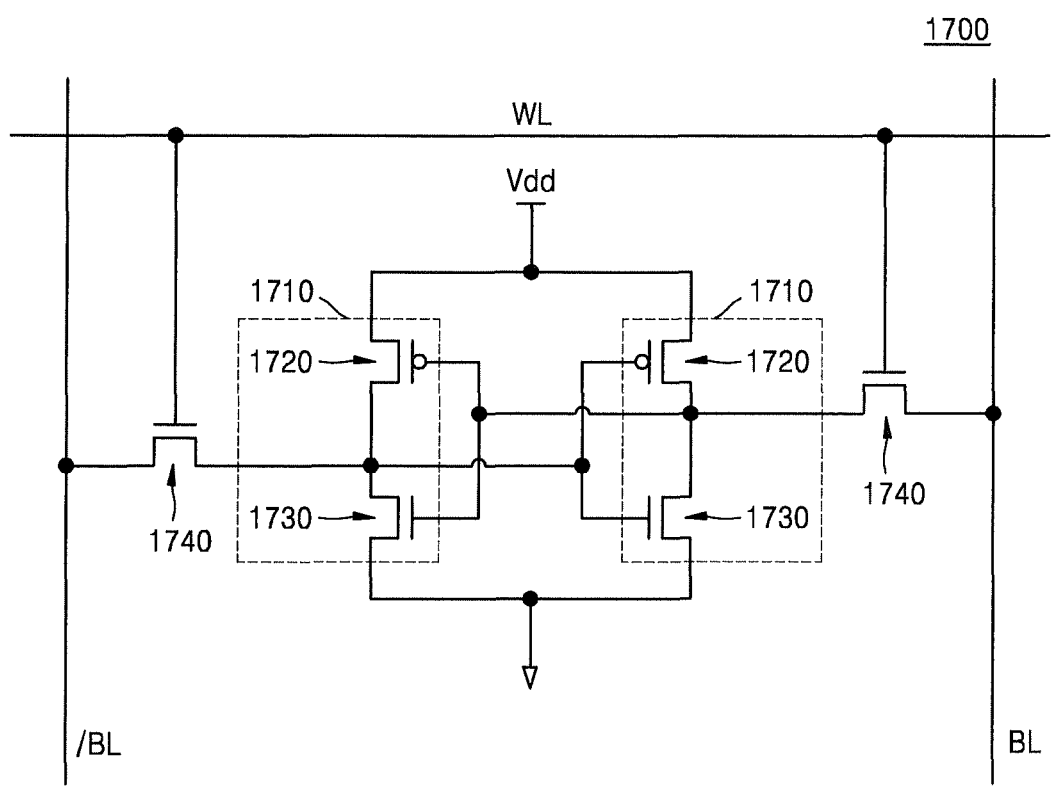
FIG. 11 is a circuit diagram illustrating a CMOS static random access memory (SRAM) device according to embodiments of the inventive concept.

FIG. 11 is a circuit diagram illustrating a CMOS SRAM device 1700 according to embodiments of the inventive concept.

The CMOS SRAM device 1700 may include a pair of driving transistors 1710. Each of the pair of driving transistors 1710 may include a PMOS transistor 1720 and an NMOS transistor 1730 that are connected between the power terminal Vdd and a ground (or reference) terminal. The CMOS SRAM device 1700 may further include a pair of transmission transistors 1740. Source terminals of the transmission transistors 1740 may be cross-connected to a common node of the PMOS transistor 1720 and the NMOS transistor 1730 of the driving transistor 1710. The power terminal Vdd may be connected to source terminals of the PMOS transistors 1720, and the ground terminal may be connected to source terminals of the NMOS transistors 1730. A word line WL may be connected to gates of the pair of transmission transistors 1740, and a bit line BL and an inverted bit line /BL may be connected to respective drains of the pair of transmission transistors 1740.

At least one of the CMOS SRAM device 1700 and the driving transistor 1710 and the transmission transistors 1740 may include at least one of the integrated circuit devices 100, 200, and 300 according to the embodiments of the inventive concept described with reference to FIGS. 1 through 6 or integrated circuit devices modified or changed from the integrated circuit devices 100, 200, and 300.

Figure 12:
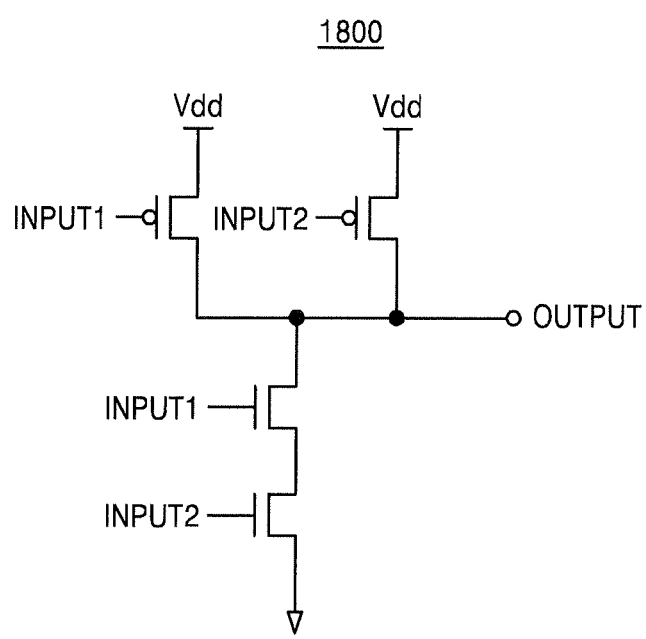
FIG. 12 is a circuit diagram illustrating a CMOS NAND circuit according to embodiments of the inventive concept.

FIG. 12 is a circuit diagram illustrating a CMOS NAND circuit 1800 according to embodiments of the inventive concept.

The CMOS NAND circuit 1800 may include a pair of CMOS transistors to which different input signals are transmitted. The CMOS NAND circuit 1800 may include at least one of the integrated circuit devices 100, 200, and 300 according to the embodiments of the inventive concept described with reference to FIGS. 1 through 6 or integrated circuit devices modified or changed from the integrated circuit devices 100, 200, and 300.

Figure 13:
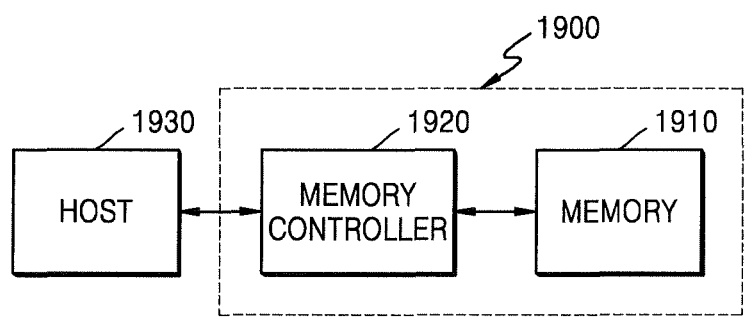
FIG. 13 is a block diagram illustrating an electronic system according to embodiments of the inventive concept.

FIG. 13 is a block diagram illustrating an electronic system 1900 according to embodiments of the inventive concept.

The electronic system 1900 may include a memory 1910 and a memory controller 1920. The memory controller 1920 may control the memory 1910 to read and/or write data from or to the memory 1910 in response to a request of a host 1930. At least one of the memory 1910 and the memory controller 1920 may include at least one of the integrated circuit devices 100, 200, and 300 according to the embodiments of the inventive concept described with reference to FIGS. 1 through 6 or integrated circuit devices modified or changed from the integrated circuit devices 100, 200, and 300.

Figure 14:
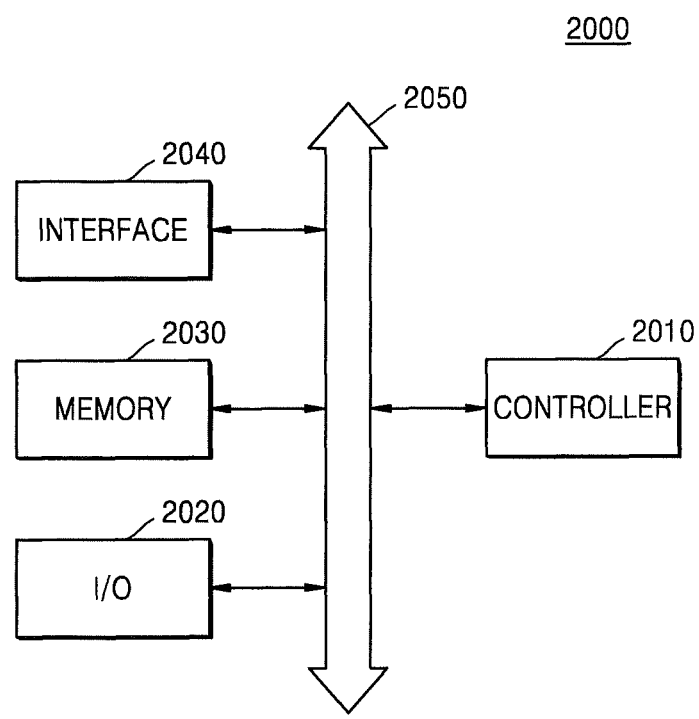
FIG. 14 is a block diagram illustrating an electronic system according to embodiments of the inventive concept.

FIG. 14 is a block diagram illustrating an electronic system 2000 according to embodiments of the inventive concept.

The electronic system 2000 may include a controller 2010, an input/output (I/O) device 2020, a memory 2030, and an interface 2040, which are connected to one another via a bus 2050.

The controller 2010 may include at least one of a microprocessor, a digital signal processor, and processors similar to the microprocessor and the digital signal processor. The I/O device 2020 may include at least one of a keypad, a keyboard, and a display. The memory 2030 may be used in storing a command executed by the controller 2010. For example, the memory 2030 may be used to store user data.

The electronic system 2000 may be configured as a wireless communication apparatus or an apparatus capable of transmitting and/or receiving information in a wireless communication environment. In order for the electronic system 2000 to transmit or receive data over a wireless communication network, the interface 2040 may be a wireless interface. The interface 2040 may include an antenna and/or a wireless transceiver. In some embodiments, the electronic system 2000 may be used in a communication interface protocol of a 3rd generation communication system such as a code division multiple access (CDMA), global system for mobile communications (GSM), North American digital cellular (NADC), extended-time division multiple access E-TDMA, and/or wide band code division multiple access (WCDMA). The electronic system 2000 may include at least one of the integrated circuit devices 100, 200, and 300 according to the embodiments of the inventive concept described with reference to FIGS. 1 through 6 or integrated circuit devices modified or changed from the integrated circuit devices 100, 200, and 300.

While the inventive concept has been particularly shown and described with reference to exemplary embodiments thereof, it will be understood that various changes in form and details may be made therein without departing from the spirit and scope of the following claims.

What is claimed is:

1. An integrated circuit device comprising:
a substrate comprising a first area and a second area;
a first fin-shaped active area in the first area and comprising a first top portion protruding from a device isolation film on the substrate in a first direction, a first width of the first top portion is measured in a second direction across opposing side walls of the first top portion at a first location, wherein the first top portion further includes a base portion having a base width at a surface of the device isolation film in the second direction; and
a second fin-shaped active area in the second area and comprising a second top portion protruding from the device isolation film on the substrate in the first direction, a second width of the second top portion is measured in the second direction across opposing side walls of the second top portion at a second location that corresponds to the first location, wherein the second width is greater than the first width and wherein the second top portion further includes a base portion having the base width at the surface of the device isolation film in the second direction,
wherein the first top portion comprises:
a first lower section active area comprising a first inclined side wall extending at a first inclination angle with respect to the first direction;
a first middle section active area on the first lower section active area in the first direction and comprising a second inclined side wall extending at a second inclination angle with respect to the first direction, wherein the second inclination angle is less than the first inclination angle;
a first upper section active area on the first middle section active area in the first direction and comprising a third inclined side wall extending at a third inclination angle with respect to the first direction, wherein the third inclination angle is greater than the second inclination angle; and
a first tip active area on the first upper section active area in the first direction and comprising a rounded upper surface,
wherein a height of the first tip active area in the first direction is less than a height of at least one of the first lower section active area, the first middle section active area, and the first upper section active area.

2. The integrated circuit device of claim 1, wherein a height from the first lower section active area to the first tip active area is at least 4 times a width of a bottom portion of the first lower section active area.

3. The integrated circuit device of claim 1, further comprising:
a gate insulating film conformally covering the first inclined side wall, the second inclined side wall, the third inclined side wall, and the rounded upper surface; and
a gate line covering the first inclined side wall, the second inclined side wall, the third inclined side wall, and the rounded upper surface,
wherein the gate insulating film is between the gate line and the first inclined side wall, the second inclined side wall, the third inclined side wall, and the rounded upper surface.

4. An integrated circuit device comprising:
a substrate comprising a first area and a second area;
at least one first fin-shaped active area in the first area and comprising a first top portion protruding from the substrate in a first direction; and
a second fin-shaped active area in the second area and comprising a second top portion protruding from the substrate in the first direction and having a shape different from that of the first top portion,
wherein the first top portion comprises:
a first lower section active area comprising a first inclined side wall extending at a first inclination angle with respect to the first direction;
a first middle section active area on the first lower section active area in the first direction and comprising a second inclined side wall extending at a second inclination angle with respect to the first direction, wherein the second inclination angle is less than the first inclination angle;
a first upper section active area on the first middle section active area in the first direction and comprising a third inclined side wall extending at a third inclination angle with respect to the first direction, wherein the third inclination angle is greater than the second inclination angle; and
a first tip active area on the first upper section active area in the first direction and comprising a rounded upper surface, and
wherein the second top portion comprises:
a second lower section active area at a level equal to a level of the first lower section active area and comprising a fourth inclined side wall extending at a fourth inclination angle less than the first inclination angle;
a second middle section active area on the second lower section active area in the first direction, at a level equal to a level of the first middle section active area, and extending at a fifth inclination angle less than the second inclination angle;
a second upper section active area protruding from the second middle section active area in the first direction and formed at a level equal to a level of the first upper section active area; and
a second tip active area on the second upper section active area in the first direction and formed at a level equal to a level of the first tip active area,
wherein a bottom portion of the first tip active area has a first width, and a bottom portion of the second tip active area has a second width greater than the first width.

5. The integrated circuit device of claim 4, wherein the second lower section active area, the second middle section active area, the second upper section active area, and the second tip active area are a unitary structure.

6. The integrated circuit device of claim 4, wherein the rounded upper surface of the first tip active area has a first curvature radius, and the second tip active area includes a rounded upper surface with a second curvature radius that is greater than the first curvature radius.

7. The integrated circuit device of claim 4, further comprising:
a device isolation film covering side walls of a pair of first fin-shaped active areas, the pair of first fin-shaped active areas being selected from the at least one first fin-shaped active area and being adjacent to each other and extending in a straight line; and a fin separation insulating film formed between the pair of first fin-shaped active areas,
wherein the pair of first fin-shaped active areas comprises respective first top portions having respective shapes that are substantially congruent.

8. An integrated circuit device comprising:
a substrate comprising a first area and a second area;
a pair of first fin-shaped active areas each having a first shape protruding from the first area in a first direction, adjacent to each other, and extending in a straight line;
a fin separation insulating film between the pair of first fin-shaped active areas in the first area; and
a second fin-shaped active area protruding from the second area in the first direction and having a second shape that is different from the first shape, wherein respective widths of each of the pair of first fin-shaped active areas are less than a corresponding width of the second fin-shaped active area.

9. The integrated circuit device of claim 8,
wherein each of the pair of first fin-shaped active areas comprises:
a first base portion comprising a side wall covered by a first device isolation film; and
a first top portion on the first base portion in the first direction and covered by a first gate line,
wherein the second fin-shaped active area comprises:
a second base portion comprising a side wall covered by a second device isolation film; and
a second top portion on the second base portion in the first direction and covered by a second gate line,
wherein a width of the first top portion is less than that of the second top portion.

10. The integrated circuit device of claim 9, wherein the first top portion comprises:
a first lower section active area comprising a first inclined side wall extending at a first inclination angle with respect to the first direction;
a first middle section active area on the first lower section active area in the first direction and comprising a second inclined side wall extending at a second inclination angle less than the first inclination angle with respect to the first direction;
a first upper section active area on the first middle section active area in the first direction and comprising a third inclined side wall extending at a third inclination angle less than the second inclination angle with respect to the first direction; and
a first tip active area on the first upper section active area in the first direction and comprising a first rounded upper surface.

11. The integrated circuit device of claim 10, wherein the second top portion comprises:
a second lower section active area at the same level as that of the first lower section active area and comprising a fourth inclined side wall extending at a fourth inclination angle less than the first inclination angle;
a second middle section active area on the second lower section active area in the first direction, at the same level as that of the first middle section active area, and extending at a fifth inclination angle less than the second inclination angle;
a second upper section active area on the second middle section active area in the first direction and formed at the same level as that of the first upper section active area; and
a second tip active area protruding from the second upper section active area in the first direction and at the same level as that of the first tip active area and comprise a second rounded upper surface.

12. The integrated circuit device of claim 11, wherein the first upper rounded surface has a first curvature radius, and the second rounded upper surface has a second curvature radius greater than the first curvature radius.

13. The integrated circuit device of claim 11, wherein a bottom portion of the first tip active area has a first width, and a bottom portion of the second tip active area has a second width greater than the first width.

* * * * *